US012781387B2

(12) United States Patent
Wang et al.

(10) Patent No.: US 12,781,387 B2
(45) Date of Patent: Nov. 3, 2026

(54) METHOD AND APPARATUS FOR PRODUCING NITROGEN COMPOUND

(71) Applicant: NATIONAL INSTITUTE OF ADVANCED INDUSTRIAL SCIENCE AND TECHNOLOGY, Tokyo (JP)

(72) Inventors: Xuelun Wang, Tsukuba (JP); Jaeho Kim, Tsukuba (JP); Naoto Kumagai, Tsukuba (JP); Hajime Sakakita, Tsukuba (JP); Hisashi Yamada, Tsukuba (JP); Tetsuji Shimizu, Tsukuba (JP)

(73) Assignee: NATIONAL INSTITUTE OF ADVANCED INDUSTRIAL SCIENCE AND TECHNOLOGY (JP)

( * ) Notice: Subject to any disclaimer, the term of this patent is extended or adjusted under 35 U.S.C. 154(b) by 289 days.

(21) Appl. No.: 18/699,882

(22) PCT Filed: Oct. 11, 2022

(86) PCT No.: PCT/JP2022/037868
§ 371 (c)(1),
(2) Date: Apr. 9, 2024

(87) PCT Pub. No.: WO2023/063310
PCT Pub. Date: Apr. 20, 2023

(65) Prior Publication Data

US 2024/0410077 A1 Dec. 12, 2024

(30) Foreign Application Priority Data

Oct. 11, 2021 (JP) ................................ 2021-166589

(51) Int. Cl.
*C30B 25/12* (2006.01)
*C23C 16/34* (2006.01)
(Continued)

(52) U.S. Cl.
CPC .............. *C30B 25/14* (2013.01); *C23C 16/34* (2013.01); *C23C 16/45563* (2013.01);
(Continued)

(58) Field of Classification Search
CPC .............. C23C 16/34; C23C 16/35563; C23C 16/4584; C23C 16/513; C30B 25/14; C30B 25/12; C30B 29/403
See application file for complete search history.

(56) References Cited

U.S. PATENT DOCUMENTS 6,656,831 B1 * 12/2003 Lee ........................ C23C 16/34
438/653
6,738,880 B2 * 5/2004 Lai ...................... G11C 7/1051
710/60
(Continued)

FOREIGN PATENT DOCUMENTS

CN 103518267 A 1/2014
JP 01-298725 A 12/1989
(Continued)

OTHER PUBLICATIONS

International Search Report mailed Jan. 10, 2023 in corresponding PCT International Application No. PCT/JP2022/037868.
(Continued)

*Primary Examiner* — Robert M Kunemund
(74) *Attorney, Agent, or Firm* — OSTROLENK FABER LLP

(57) ABSTRACT

Provided is a method and apparatus for producing a nitrogen compound through vapor phase growth using a gas supply module having a nozzle surface which faces a substrate, in which a plasma source gas containing a nitrogen element is converted into a plasma, the plasma is discharged toward the substrate from a plasma nozzle having an opening placed on the nozzle surface, a raw material gas is discharged from a
(Continued)

raw material nozzle that opens around the outside of the plasma nozzle on the nozzle surface, and an active species containing nitrogen contained in the plasma is reacted with the raw material gas to form a nitrogen compound film on the substrate.

18 Claims, 14 Drawing Sheets

(51) Int. Cl.

| | |
|---|---|
| ***C23C 16/455*** | (2006.01) |
| ***C23C 16/458*** | (2006.01) |
| ***C23C 16/513*** | (2006.01) |
| ***C30B 25/14*** | (2006.01) |
| ***C30B 29/40*** | (2006.01) |

(52) U.S. Cl.

CPC ........ *C23C 16/4584* (2013.01); *C23C 16/513* (2013.01); *C30B 25/12* (2013.01); *C30B 29/403* (2013.01)

(56) References Cited

U.S. PATENT DOCUMENTS

2002/0000202 A1* 1/2002 Yuda ..................... C23C 16/402 156/345.35
2008/0179587 A1* 7/2008 Namkoong .......... H10H 20/825 257/E33.014
2011/0207256 A1* 8/2011 Su ........................... H10P 14/24 438/46
2014/0183580 A1 7/2014 Udagawa
2014/0273452 A1* 9/2014 Blomberg ............... H10P 14/43 438/680
2016/0329192 A1 11/2016 Sieber et al.
2019/0271083 A1* 9/2019 Isobe .................... C23C 16/505

FOREIGN PATENT DOCUMENTS

| | | | |
|---|---|---|---|
| JP | 11-087253 | A | 3/1999 |
| JP | 2002-016056 | A | 1/2002 |
| JP | 4610069 | B2 * | 1/2011 |
| JP | 2012-243934 | A | 12/2012 |
| JP | 2018-073999 | A | 5/2018 |
| JP | 2019-153690 | A | 9/2019 |
| KR | 10-2016-0048194 | A | 5/2016 |
| KR | 10-2021-0088722 | A | 7/2021 |
| TW | I435385 | B | 4/2014 |
| TW | I734896 | B | 8/2021 |

OTHER PUBLICATIONS

Office Action mailed Nov. 17, 2023 in corresponding Taiwanese Application No. 111138357.

* cited by examiner

METHOD AND APPARATUS FOR PRODUCING NITROGEN COMPOUND

TECHNICAL FIELD

The present invention relates to a method and apparatus for producing a nitrogen compound through vapor phase growth.

Priority is claimed on Japanese Patent Application No. 2021-166589, filed on Oct. 11, 2021, the content of which is incorporated herein by reference.

BACKGROUND ART

A metal organic chemical vapor deposition (MOCVD) method is known in which a raw material containing an organic metal is transported onto a substrate (wafer) together with a carrier gas, decomposed at a high temperature, and subjected to a chemical reaction to form a thin film by epitaxial growth.

For example, Patent Document 1 discloses a method for producing a Group III nitride semiconductor film using a vertical MOCVD device, in which a flat plate-shaped showerhead electrode is incorporated so that a main surface of the electrode faces a substrate in a furnace. Specifically, a mixed gas containing nitrogen is supplied from a plurality of through holes provided on the main surface of the flat-shaped showerhead electrode. Immediately below the showerhead electrode, the mixed gas is converted into a plasma to forma radical mixed gas containing nitrogen radicals, electrons, and other charged particles, and the mixed gas is sent out toward the substrate in the form of a shower. On the other hand, an organometallic gas of group III metals is supplied toward the substrate from the plurality of through holes in a ring portion, which is located below the showerhead electrode and near the substrate. It is disclosed that the organometallic gas is engulfed by the radical mixed gas and reaches the substrate, whereby a Group III nitride semiconductor film having a predetermined component composition can be formed on the substrate.

CITATION LIST

Patent Document

[Patent Document 1]
Japanese Unexamined Patent Application, First Publication No. 2018-073999

SUMMARY OF INVENTION

Technical Problem

It is required to form a nitrogen compound thin film, which is made of a high-grade Group III-V compound with few defects, on a substrate by organometallic vapor phase growth. In particular, with respect to a nitrogen compound containing In, practical high-quality nitrogen compound thin film, which contains 25% or more of In, has not been obtained. For this reason, it is required to form a high-grade nitrogen compound thin film, while preferably adjusting the In content. In order to satisfy these requirements, it is necessary to progress a reaction, while obtaining a nitrogen atom density on the substrate, which is sufficient for film formation, and controlling a supply of a raw material gas.

The present invention has been made in consideration of the above-described problems, and an object of the present invention is to provide a method and apparatus for producing a nitrogen compound, which provide a high-quality nitrogen compound thin film.

Solution to Problem

In the vapor phase growth method, the present inventors have found that it is possible to obtain a nitrogen atom density ($10^{14}$ $cm^{-3}$ or more), which is required for forming a nitrogen compound thin film, by shortening the distance between the plasma source and the substrate, even if the pressure inside a container containing them is relatively high (1 kPa or higher). As a result of their research, they have arrived at the idea of using a gas supply module that has a smaller opening which is used for discharging a plasma and also has an opening which is used for discharging a raw material gas and located around the outside of the smaller opening. As a result of using the above-described method and apparatus, the mean free path of ions can be made smaller than the Debye length, ion impact on the substrate can be significantly reduced, and the raw material gas can be supplied into the plasma with good control. As a result, they have found that a high-quality nitrogen compound thin film can be obtained. In particular, with respect to In-based nitrogen compounds, practical high-quality nitrogen compound thin film containing 25% or more of In has not been obtained in the past. However, according to the present invention, a high-quality thin film can be obtained, while preferably adjusting the In content.

The present invention provides a method for producing a nitrogen compound through vapor phase growth using a gas supply module having a nozzle surface facing a substrate, the method including: converting a plasma source gas containing a nitrogen element into a plasma to discharge the plasma toward the substrate from a plasma nozzle having an opening placed on the nozzle surface; then discharging a raw material gas from a raw material nozzle that opens around the outside of the plasma nozzle on the nozzle surface, and then reacting the raw material gas with an active species containing nitrogen contained in the plasma to form a nitrogen compound film on the substrate.

In other words, the production method of a first aspect of the present invention is a method for producing a nitrogen compound, wherein the method is performed through vapor phase growth using a gas supply module which has a nozzle surface which faces a substrate placed on a placement portion, wherein the method comprising: converting a plasma source gas containing a nitrogen element into a plasma, and discharging the formed plasma toward the substrate from an opening of a plasma nozzle which is placed on the nozzle surface; discharging a raw material gas from an opening of a raw material nozzle, wherein the opening of the raw material nozzle is arranged on the nozzle surface and around the outside of the opening of the plasma nozzle; and reacting an active species, which contains nitrogen and are contained in the discharged plasma, with the raw material gas to form a nitrogen compound film on the substrate.

It is also preferable that the discharge of the raw material gas from the raw material nozzle be started, after the discharge of the plasma from the plasma nozzle is started.

In addition, the present invention provides an apparatus for producing a nitrogen compound through vapor phase growth using a gas supply module having a nozzle surface facing a substrate, in which the gas supply module includes a plasma nozzle that discharges a plasma obtained by being converted from a plasma source gas containing a nitrogen element toward the substrate from an opening placed on the nozzle surface, and a raw material nozzle that opens around the outside of the plasma nozzle on the nozzle surface and discharge a raw material gas, and an active species containing nitrogen contained in the plasma is reacted with the raw material gas to form a nitrogen compound film on the substrate.

In other words, the production apparatus of a second aspect of the present invention is an apparatus for producing a nitrogen compound, wherein the apparatus produces the nitrogen compound through vapor phase growth using a gas supply module which has a nozzle surface facing a substrate, which is placed on a placement portion, wherein the gas supply module includes; a plasma nozzle which has an opening placed on the nozzle surface and discharges a plasma, which is obtained by being converted from a plasma source gas containing a nitrogen element, toward the substrate from the opening, and raw material nozzle which has an opening, which is arranged on the nozzle surface and around the outside of the opening of the plasma nozzle, and discharge a raw material gas from the opening; and wherein an active species containing nitrogen contained in the discharged plasma is reacted with the discharged raw material gas to form a nitrogen compound film on the substrate.

According to the features of the present invention, a high-quality nitrogen compound film can be formed due to a high nitrogen atom density on a substrate, wherein the density is provided by a preferable prescribed gas supply module, in which a plasma nozzle, a raw material nozzle, and an inclusion gas nozzle are provided.

DESCRIPTION OF EMBODIMENT

Figure 1:
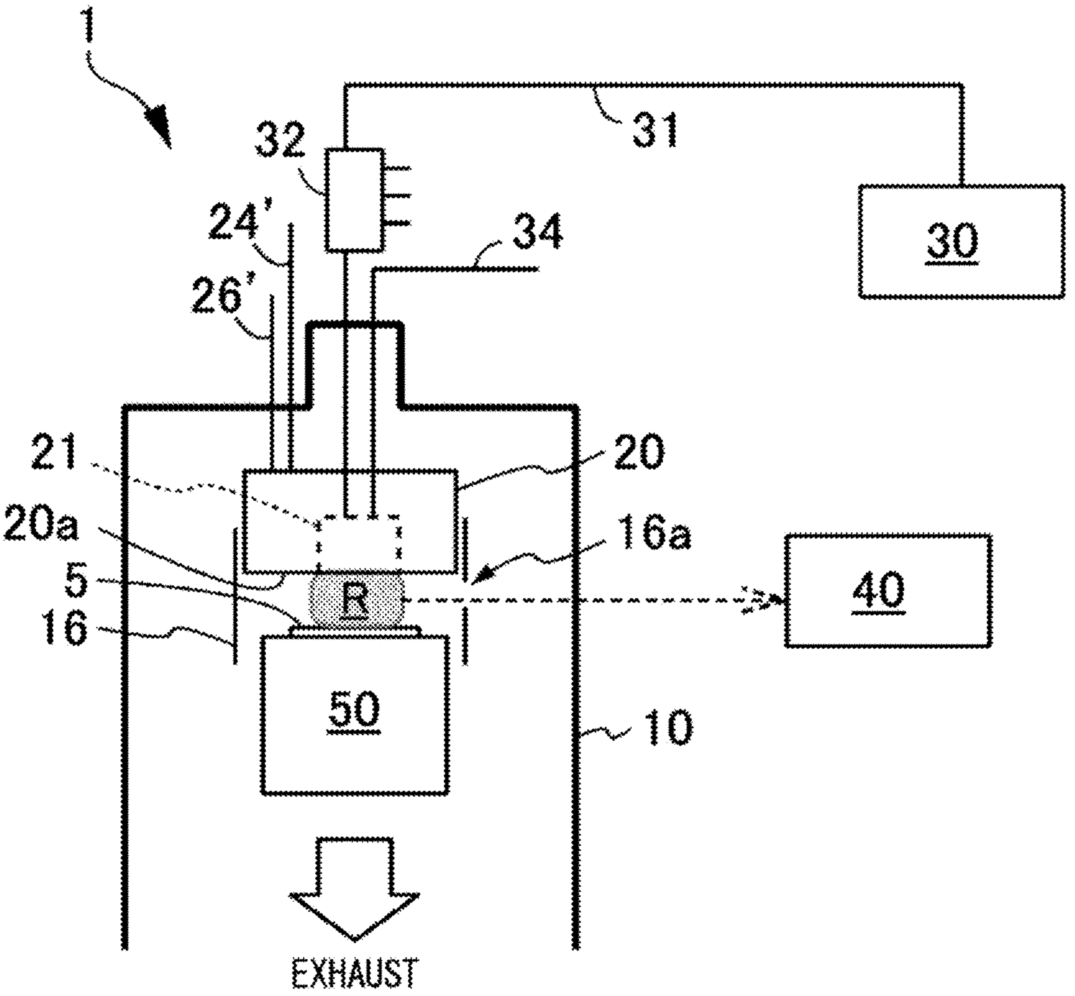
FIG. 1 is a schematic diagram illustrating a preferred example of a production apparatus according to the present invention.

Hereinafter, preferred examples of a method and apparatus for producing a nitrogen compound of the present invention will be described in detail. The present invention is not limited to only the embodiment shown below. The configuration described below can be modified as appropriate within the scope not departing from the scope of the present invention. For example, numbers, amount, ratios, compositions, types, positions, materials, orders, sizes, forms, configurations, and the like can be added, omitted, replaced, or modified within the scope not departing from the gist of the present invention.

The present invention can be preferably used as a material supply device, when a nitrogen compound consisting of Group III-V compounds are produced. For example, binary compounds such as GaN (gallium nitride), InN (indium nitride), AlN (aluminum nitride), and BN (boron nitride) or ternary or more multi-element compounds such as InGaN (indium gallium nitride) which contain combinations thereof or three or more types of atoms in the compounds can be produced. A nitrogen compound film of the present invention can preferably contain at least one of the aforementioned compounds. The nitrogen compound can be used in light emitting devices (laser diodes and light emitting diodes), light receiving devices (full-wavelength solar cells and photodetectors), power devices, and the like, and can also be expected to be applied to head-mounted displays for augmented reality as next-generation full-color LEDs with high brightness, high resolution, and low power consumption. In particular, according to the present invention, a high-quality nitrogen compound thin film containing 25% or more of In can be obtained using In-based nitrogen compounds. In particular, indium nitride can be used not only in light emitting devices or light receiving devices, but also preferably in high-frequency devices such as heterojunction field-effect transistors (HFETs), memories, and central processing units (CPUs) since it has a large electron mobility and a significantly small temperature dependence of an emission wavelength from a band end. The amount of In in an In-containing nitrogen compound produced in the present invention can be arbitrarily selected, and may be, for example, 10% or more, 25% or more, 30% or more, 35% or more, 40% or more, 45% or more, 50% or more, 55% or more, or 60% or more.

Hereinafter, as an example of a preferred embodiment of the present invention, an apparatus and method for producing a nitrogen compound through vapor phase growth using a gas supply module having a nozzle surface facing a substrate will be described with reference to FIGS. 1 to 6. The substrate is preferably placed on a susceptor, that is, on the surface of a substrate placement portion of the susceptor in the apparatus, before start of vapor phase growth. Examples of substrates include GaN, sapphire, silicon, and silicon carbide. A substrate made of a combination of the materials, for example, a substrate in which a GaN film is formed on a sapphire substrate can also be used.

Although starting discharge of a raw material gas after starting discharge of a plasma is shown as a preferred example, there is no limitation to only this example. The order of starting discharge of a raw material gas, a plasma, and an inclusion gas and the order of stopping the discharge thereof may be arbitrarily selected as necessary. For example, discharge of a raw material gas may be started after starting discharge of a plasma and/or an inclusion gas, discharge of a raw material gas, a plasma, and/or an inclusion gas may be simultaneously started, or discharge of a plasma and/or an inclusion gas may be started after discharging a raw material gas. In addition, discharge of a plasma and/or an inclusion gas may be stopped after stopping discharge of a raw material gas, discharge of a raw material gas, a plasma, and/or an inclusion gas may be simultaneously stopped, or discharge of a raw material gas and/or an inclusion gas may be stopped after stopping discharge of a plasma.

FIG. 1 shows a preferred example of the production apparatus of the present invention. As shown in FIG. 1, a susceptor system 50 which can heat a substrate 5 placed thereon while rotating the substrate in the horizontal plane is installed in a container (furnace body) 10 of an apparatus 1 for producing a nitrogen compound. A gas supply module 20 is installed above the susceptor system 50. The gas supply module 20 is installed at a predetermined distance from the mounting surface of the susceptor system 50, with its nozzle surface 20*a* facing the substrate 5 and the mounting surface.

The shape and size of the nozzle surface 20*a* can be arbitrarily selected, and for example, the nozzle surface may be circular in a plan view, and may be larger than the substrate 5 or the mounting surface. The nozzle surface 20*a* and the substrate 5 and the mounting surface are preferably parallel to each other. The nozzle surface 20*a* may be a flat surface, but may also have a concave portion and/or convex portion at any location such as a center portion thereof. The shapes of the concave portion or convex portion can be arbitrarily selected, and for example, the concave portion or convex portion may be circular in a plan view or may have a smooth curved surface.

The shapes and sizes of the container 10, susceptor system 50, and gas supply module 20 can be arbitrarily selected, and for example, the shapes may be cylindrical or columnar, or substantially cylindrical or substantially columnar, but there is no limitation to only these examples. The size and shape of the substrate which is placed on the susceptor system 50 to form a nitrogen compound on the surface of the substrate can be arbitrarily selected, and for example, the substrate may have a disc shape with a size of 2 inches, 4 inches, or 6 inches.

The gas supply module 20 includes a plasma source 21 that discharges a plasma, which is obtained by degrading a plasma source gas using high frequency power, toward the substrate 5. High frequency power, which is in the form of a continuous wave or a pulse wave, is supplied to the plasma source 21 from a power source 30 via a coaxial cable 31, a stub tuner 32, and a connector (not shown in the drawing). In addition, a plasma source gas which contains a nitrogen element is introduced into the plasma source 21 from a gas supply pipe 34. Furthermore, the gas supply module 20 is connected with a raw material supply pipe 24', that supplies a raw material gas consisting of an organic metal of a Group III element, and is connected with an inclusion gas supply pipe 26', that supplies an inclusion gas containing a Group V element. Preferred examples of raw material gases used in the present invention include an organometallic gas which contains In. In the production method and apparatus of the present invention, an inclusion gas containing a Group V element is preferably discharged toward a substrate from an inclusion gas nozzle that opens further outward from an opening of a raw material nozzle on the nozzle surface.

In this configuration, a cover 16 is provided so that diffusion of the raw material gas and the inclusion gas can be suppressed to control the gas flow, and the gases are guided to a lower portion of the container 10 toward the exhaust direction. The position, size, and number of exhaust ports of the gases in the container 10 can be arbitrarily selected. In addition, as necessary, a spectroscopy system 40 is incorporated which spectrally analyzes a plasma light emitting part R, which is located in the vicinity of the surface of the substrate 5, through a hole portion 16*a* provided in the cover 16. The material constituting all or part of the container 10 can be arbitrarily selected. For example, the apparatus 10 may have a view port, and synthetic quartz, Kovar glass, Pyrex, or the like can be used as a material for the view port as necessary to enable evaluation of the plasma light emitting part R using the spectroscopy system 40.

Figure 2:
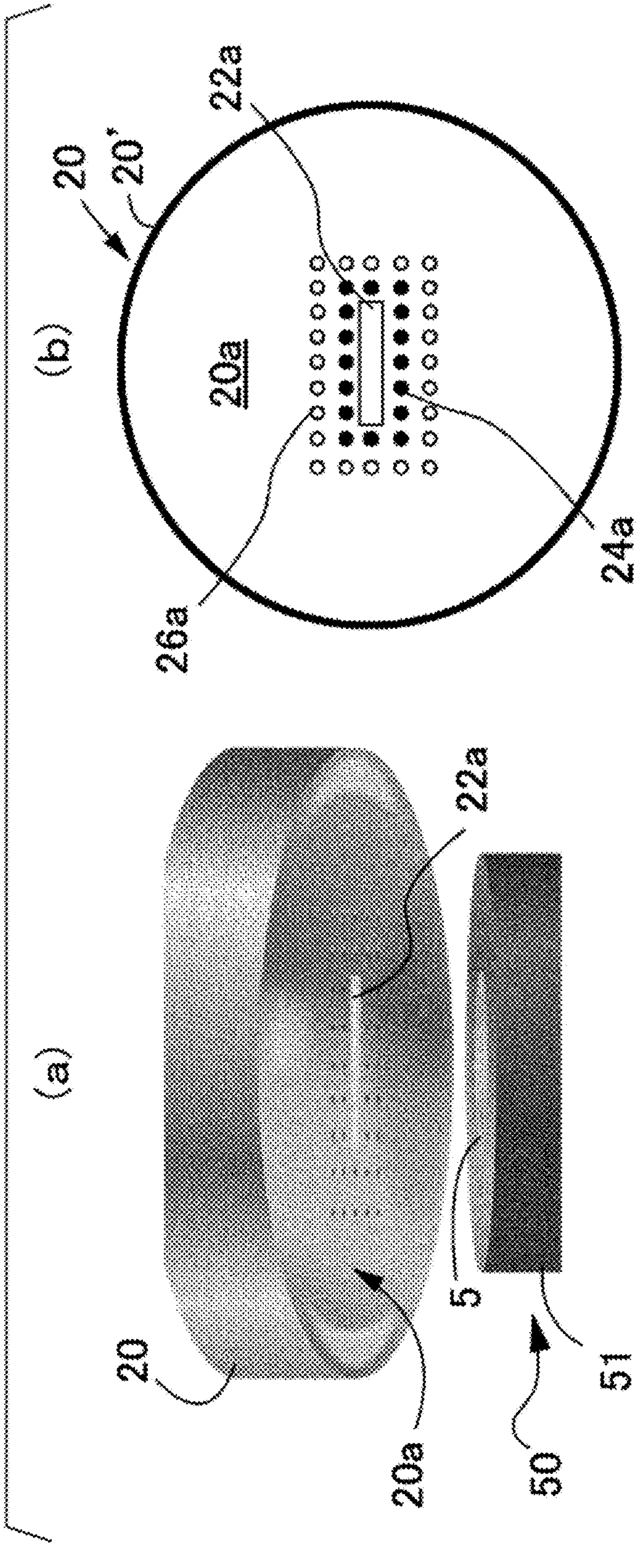
FIG. 2 shows schematic diagrams illustrating main parts of the preferred example of the production apparatus according to the present invention.

FIG. 2 shows an example of main parts of the production apparatus according to the present invention. (a) of FIG. 2 schematically shows an example of a configuration of the susceptor system 50 and the gas supply module 20, and (b) of FIG. 2 is a schematic top view of the nozzle surface 20*a* used in (a).

Figure 3:
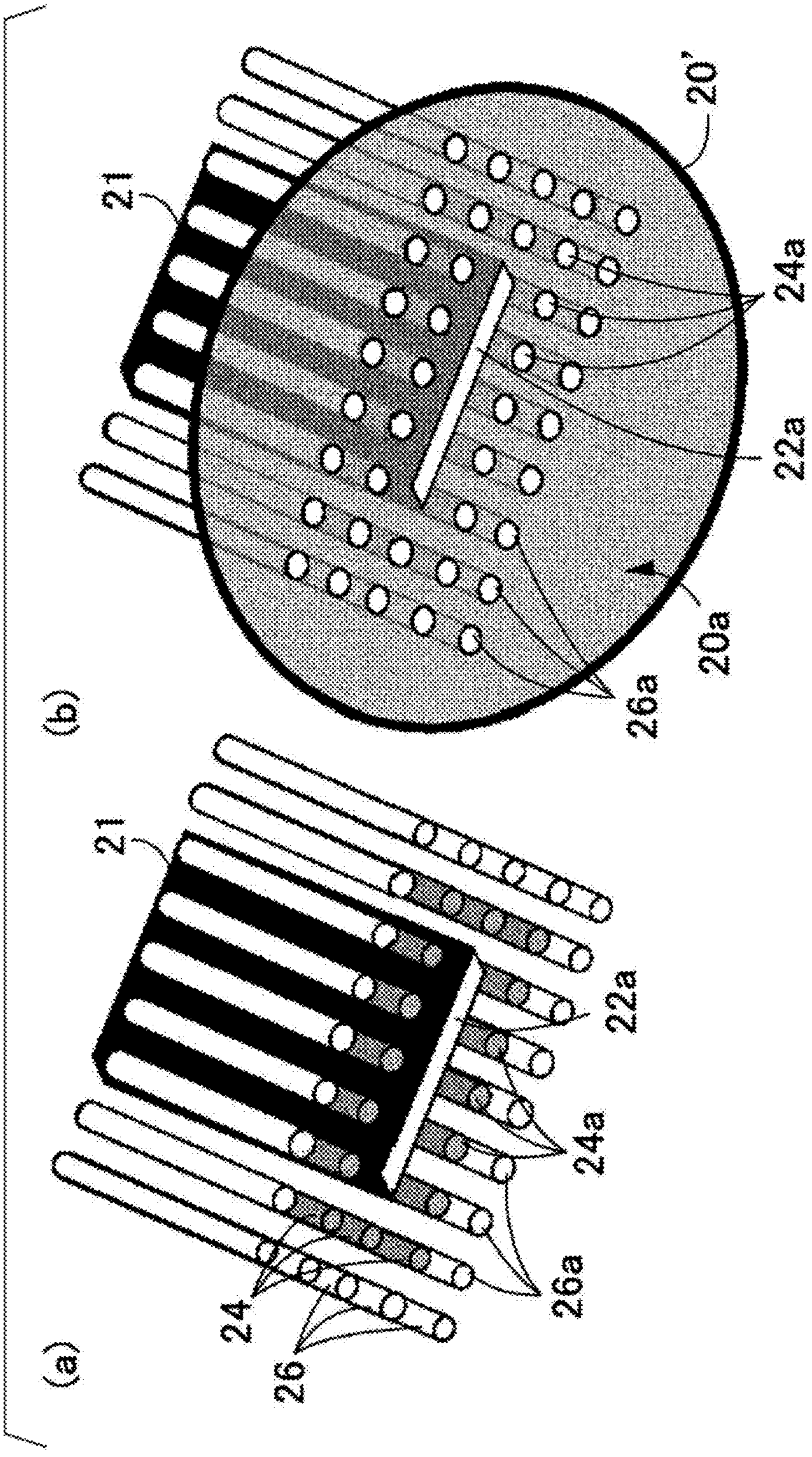
FIG. 3 shows schematic perspective views illustrating preferred examples of a gas supply module according to the present invention.

FIG. 3 shows preferred examples of the gas supply module according to the present invention, in which (a) shows a case without a head plate 20' and (b) shows a case with a head plate 20'.

As schematically shown in FIGS. 2 and 3, the lower portion of the gas supply module 20 has a nozzle surface 20*a*. In the examples shown in (a) and (b) of FIG. 2 and (a) of FIG. 3, the substantially disk-shaped head plate 20', which is preferably concave in its center in a substantially bowl shape, is preferably attached to the lower portion of the gas supply module 20 either integrally with or separately from the main body unit, so as to define the nozzle surface 20*a*. Specifically, in the example of (a) and (b) of FIG. 2, the gas supply module 20 and the head plate 20' are integrally formed. At substantially the center of the nozzle surface 20*a*, a plasma nozzle 22 of the plasma source 21 opens its distal portion 22*a*. The opening of the distal portion 22*a* may be provided flush with the nozzle surface 20*a*, that is, without a step, but may not necessarily be flush therewith or may be protruded or recessed (retracted). The number, shape, or placement of openings of distal portions 22*a* of plasma nozzles 22 can be arbitrarily selected. For example, the number of the openings may be at least one, or may be 1 to 5, 5 to 10, 10 to 30, 30 to 50, 50 to 100, 100 to 300, 300 to 1,000, or 1,000 to 10,000. For example, the shape and placement of the opening can be arbitrarily selected, and may be rectangular, square, substantially quadrangular, circular, or elliptical in a plan view. Regarding the placement of the opening, for example, one opening may be placed at the center of the nozzle surface 20*a*, or two or more openings may be arranged symmetrically with respect to a straight line passing through the center of the nozzle surface 20*a*. Regarding the arrangement shape of a plurality openings, the openings may be arranged linearly, parallel to each other, in a cross shape, or in combination thereof. The distance between adjacent openings of the plasma nozzles 22 is preferably the same as each other, but there is no limitation to only this example.

In addition, on the nozzle surface 20*a*, a plurality of openings 24*a* of raw material nozzles 24, which are used for discharging a raw material gas consisting of an organic metal of a Group III element, are provided around the outside of the distal portions 22*a* (openings) of the plasma nozzles 22 at arbitrarily selected regular intervals, so as to surround the openings of the plasma nozzles 22. The raw material gas is preferably discharged from the openings 24*a* toward the placement portion of the substrate. The openings 24*a* of the raw material nozzles 24 can also be preferably provided between adjacent openings of the plasma nozzles 22. The number, shape, or arrangement of the openings 24*a* of the raw material nozzles 24 can be arbitrarily selected. For example, the number of the openings may be 1 or more, preferably 10 or more, more preferably 16 or more, or may be 16 to 25, 25 to 50, 50 to 100, 100 to 300, 300 to 1,000, or 1,000 to 10,000. For example, the shape and arrangement of the openings 24*a* of the raw material nozzles 24 may be rectangular, square, substantially quadrangular, circular, elliptical, or a combination thereof. The distance between an opening of a raw material nozzle 24 and an opening of a plasma nozzle 22 adjacent to each other can be arbitrarily selected, and examples thereof include 1 to 2 times, 2 to 4 times, 4 to 6 times, and 6 to 8 times the diameter or shortest side length of the opening of the raw material nozzle 24, but there is no limitation to only these examples. The opening 22*a* of the plasma nozzle 22 and the opening 24*a* of the raw material nozzle 24 are preferably provided only in an area that overlaps the substrate in a plan view, but as necessary, they may be provided both inside and outside the area that overlaps the substrate. Furthermore, a plurality of openings of inclusion gas nozzles 26, which are used for discharging an inclusion gas containing a Group V element, are provided around the outside of the raw material nozzles 24 at arbitrarily selected regular intervals, so as to surround the openings 24*a* of the raw material nozzles 24. The inclusion gas nozzles 26 are preferably provided in the area that overlaps the substrate and/or in the vicinity of the area in a plan view. The number, shape, or arrangement of the openings 26*a* of the inclusion gas nozzles 26 can be arbitrarily selected. For example, the number of the openings is preferably 18 or more, more preferably 24 or more. The number of the openings may be, for example, 1 to 24, 25 to 50, 50 to 80, 80 to 100, or 100 or more. For example, the shape or arrangement of the openings 26*a* thereof can be arbitrarily selected, and may be rectangular, square, substantially quadrangular, circular, elliptical, or a combination thereof. The distance between an opening 26*a* of an inclusion gas nozzle 26 and an opening 24*a* of a raw material nozzle 24 adjacent to each other can be arbitrarily selected, and examples thereof include 1 to 2 times, 2 to 4 times, 4 to 6 times, and 6 to 8 times the diameter or shortest side length of the opening 24*a* of the raw material nozzle 24, but there is no limitation to only these examples. The ratio of the number of the openings 24*a* of the raw material nozzle 24 to the number of the openings 26*a* of the inclusion gas nozzle 26 can be arbitrarily selected. Examples of the ratio include 1:2 to 2:1, 1:1.5 to 1.5:1, 1:1.3 to 1.3:1, 1:1.2 to 1.2:1, and 1:1.1 to 1.1:1. Specifically, the ratio may be 16:24, 28:36, 55:69, 24:32, 48:56, 30:30, 33:36, or 61:34. The number of the openings 26*a* is preferably greater than the number of the openings 24*a*, but is there is no limitation to only this example. The raw material nozzles 24 and the inclusion gas nozzles 26 may be provided inside the gas supply module 20 such that each pipe is branched into a plurality of pipes to allow communication with a plurality of openings. In FIG. 3, the number of the openings 22*a* of the plasma nozzles 22 is one, the number of the openings 24*a* of the raw material nozzles 24 is 16, and the number of the openings 26*a* of the inclusion gas nozzles 26 is 24.

The substantially disk-shaped head plate 20' that defines the nozzle surface 20*a* may or may not be provided. However, by providing the head plate 20', a raw material gas, an inclusion gas, a plasma, active particles, and the like generated thereby can be prevented from diffusing upstream (to the top), along the outer circumferential walls of the raw material nozzles 24, inclusion gas nozzles 26, and the like. In addition, it is also possible to prevent the influence of radiation heat on the plasma source 21 and the like wherein the heat is generated due to heating of the substrate 5 in the susceptor system 50 described below.

The susceptor system 50 (susceptor device) includes a susceptor 51, and its upper surface (placement surface) is provided to face the nozzle surface 20*a* of the gas supply module 20. The structure and material of the susceptor system 50 can be arbitrarily selected. For example, the upper surface of the susceptor 51 which may be made of graphite is preferably provided with a coating of silicon carbide. The substrate 5 can be placed on the susceptor 51 and can be heated and rotated in a horizontal plane. By performing in-plane rotation of the substrate 5, the position of the substrate 5 which faces the distal portion (opening) 22*a* of the plasma nozzle 22 can be changed, that is, can be moved. As a result, even if the shape of the distal portion 22*a* of the plasma nozzles 22 are small and different from the shape of the substrate 5, for example, a slit shape, a thin film of a nitrogen compound can be uniformly formed on the substrate 5. In this manner, in the production method of the first aspect, it is preferable to in-plane rotate the substrate and move the position of the substrate facing the opening of the plasma nozzle. In addition, the distance between the substrate 5 and the distal portions (openings) 22*a* of the plasma nozzles 22 can be adjusted by the susceptor 51. In this manner, it is preferable that the production apparatus of the present invention include a susceptor that in-plane rotates the substrate and moves the position of the substrate facing the opening of the plasma nozzle. The distance between the substrate and the opening can be arbitrarily selected, but is preferably close to 150 mm or less, more preferably 120 mm or less, still more preferably 80 mm or less, and particularly preferably 50 mm or less. The distance may be, for example, 0.05 to 30 mm, 0.1 to 20 mm, 1 to 10 mm, or 2 to 8 mm. By making such an adjustment, it is possible to provide a high nitrogen atom density on the substrate 5, even if the pressure inside the container 10 is relatively high.

Figure 4:
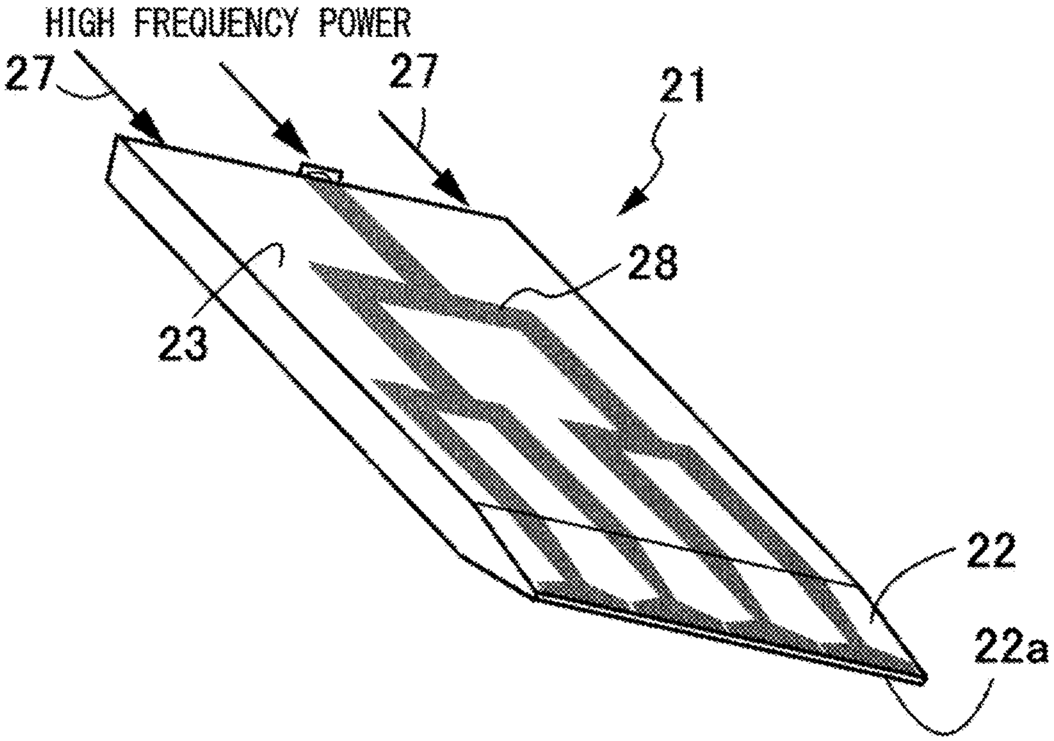
FIG. 4 is a schematic perspective view illustrating a preferred example of a plasma source of the production apparatus according to the present invention.

FIG. 4 shows a preferred example of a plasma source (plasma forming device) of the production apparatus of the present invention. As shown in FIG. 4, the plasma source 21 consists of a plate-shaped dielectric substrate 23 preferably having an internal space. In the plate-shaped dielectric substrate 23, a plasma source gas containing a nitrogen element such as nitrogen gas or ammonia is supplied to a space (not shown in the drawing) inside the dielectric substrate 23 via a gas supply path 27 which is connected to the gas supply pipe 34. The supplied plasma source gas flows to the distal portion 22*a* of the plasma nozzle 22 which is opened in a slit shape. In addition, high frequency power is guided and propagates from the power source 30 to a microstrip line 28, which is provided on the dielectric substrate 23, and is applied to the interior and/or peripheral portion of the distal portion 22*a* of the plasma nozzle 22. As a result, the plasma source gas is decomposed and a plasma is generated by the application, and the plasma is released from the distal portion 22*a* of the plasma nozzle 22. The shape of the microstrip line 28 can be arbitrarily selected. As the plasma source 21, for example, those well known from PCT International Publication No. WO 2017/078082 may be used.

The plasma source gas is a gas containing a nitrogen element. The plasma source gas is, for example, nitrogen or ammonia gas, and may be mixed with hydrogen gas or an inert gas (such as argon or helium) as appropriate. The proportion of an inert gas in the gas mixture can be arbitrarily selected. By mixing with an inert gas, a plasma can be stably maintained even if the pressure inside the container 10 is high, which is preferable. In addition, the gas flow rate can also be adjusted as appropriate, but is typically within a range of 0.1 to 10 L/min. For example, the gas flow rate may be 0.1 to 1 L/min, 1 to 5 L/min, or 5 to 8 L/min.

The power source 30, which is connected to the plasma source 21, generates high frequency as a continuous wave or a pulse wave between 900 MHz and 5 GHz, and its power is adjusted within a range of approximately 0 to 200 W.

Here, the shape, width, and gap of the distal portion 22*a* (opening) used for discharging a plasma, which is located at the distal end of the plasma nozzle 22, can be arbitrarily set, in consideration of supply of a raw material gas from the raw material nozzles 24 and the state of film formation on the substrate 5. In Examples to be described below, the size (cross section) of the distal portion 22*a* is set to one slit-shaped rectangle with a width (breadth) of 40 mm and a gap (length) of 0.2 mm. The distal portion 22*a* of the plasma nozzle 22 may be arranged singly or in multiples as circular or different shaped openings, instead of the rectangular slit-shaped opening.

Furthermore, as the plasma source 21, a small capacitively coupled plasma source, a small inductively coupled plasma source, a small hollow cathode plasma source, or the like other than those described above may be used.

In addition, it is preferable that the plasma source 21 be additionally provided with means such as members or device used for preventing overheating or thermal damage, so that the plasma source is thermally protected from heat, which is accompanied with power supply from the power source 30, and radiation heat, which is generated when the substrate 5 is heated in the susceptor system 50. For example, a water-cooled tube that cools the plasma source 21 may be provided, and/or a heat flow path that releases heat of the plasma source 21 to the outside of the vacuum container 10 may be provided.

The raw material nozzles 24 open around the outside of the plasma nozzle 22 on the nozzle surface 20*a*, and discharge a raw material gas consisting of an organic metal of a Group III element which is arbitrarily selected depending on a nitrogen compound consisting of a Group III-V compound to be obtained. Examples of raw material gases include triethyl gallium (TEG), trimethyl gallium (TMG), trimethyl indium (TMI), a mixed gas of triethyl gallium (TEG) and trimethyl indium (TMI), and a mixed gas of trimethyl gallium (TMG) and trimethyl indium (TMI). Specifically, it is preferable that a raw material gas be, for example, triethyl gallium (TEG) or trimethyl gallium (TMG) if a formed compound is a Ga-based nitrogen compound, a gas consisting of trimethyl indium (TMI) if a formed compound is an In-based nitrogen compound, or a mixed gas, in which a part of TMI is substituted with TEG or TMG, if a formed compound is a GaN nitrogen compound containing In to be described below. The gas flow rate can be adjusted as appropriate, but is typically within a range of 0.01 to 100 L/min. For example, the gas flow rate may be 0.01 to 0.1 L/min, 0.1 to 10 L/min, or 10 to 100 L/min. In the production method of the present invention, it is preferable that a raw material gas be a mixed gas consisting of a plurality of organic metals and that the amount of In in the nitrogen compound be changed by changing the amount of In-containing organic metals mixed into the mixed gas. The raw material gas may be introduced together with carrier gas such as nitrogen gas.

The inclusion gas nozzles 26 open further outward from the raw material nozzles 24 on the nozzle surface 20*a*, and discharge an inclusion gas containing, for example, a Group V element, typically nitrogen, toward the substrate 5. The inclusion gas used in this manner can control a plasma from the plasma nozzle 22, even in a case where the pressure inside the container 10 is high, and can stabilize supply of a raw material gas into a plasma and film formation of a nitrogen compound on the substrate 5. The gas flow rate can be adjusted as appropriate, but is typically within a range of 0.01 to 100 L/min. For example, the gas flow rate may be 0.01 to 0.1 L/min, 0.1 to 10 L/min, or 10 to 100 L/min.

Figure 5:
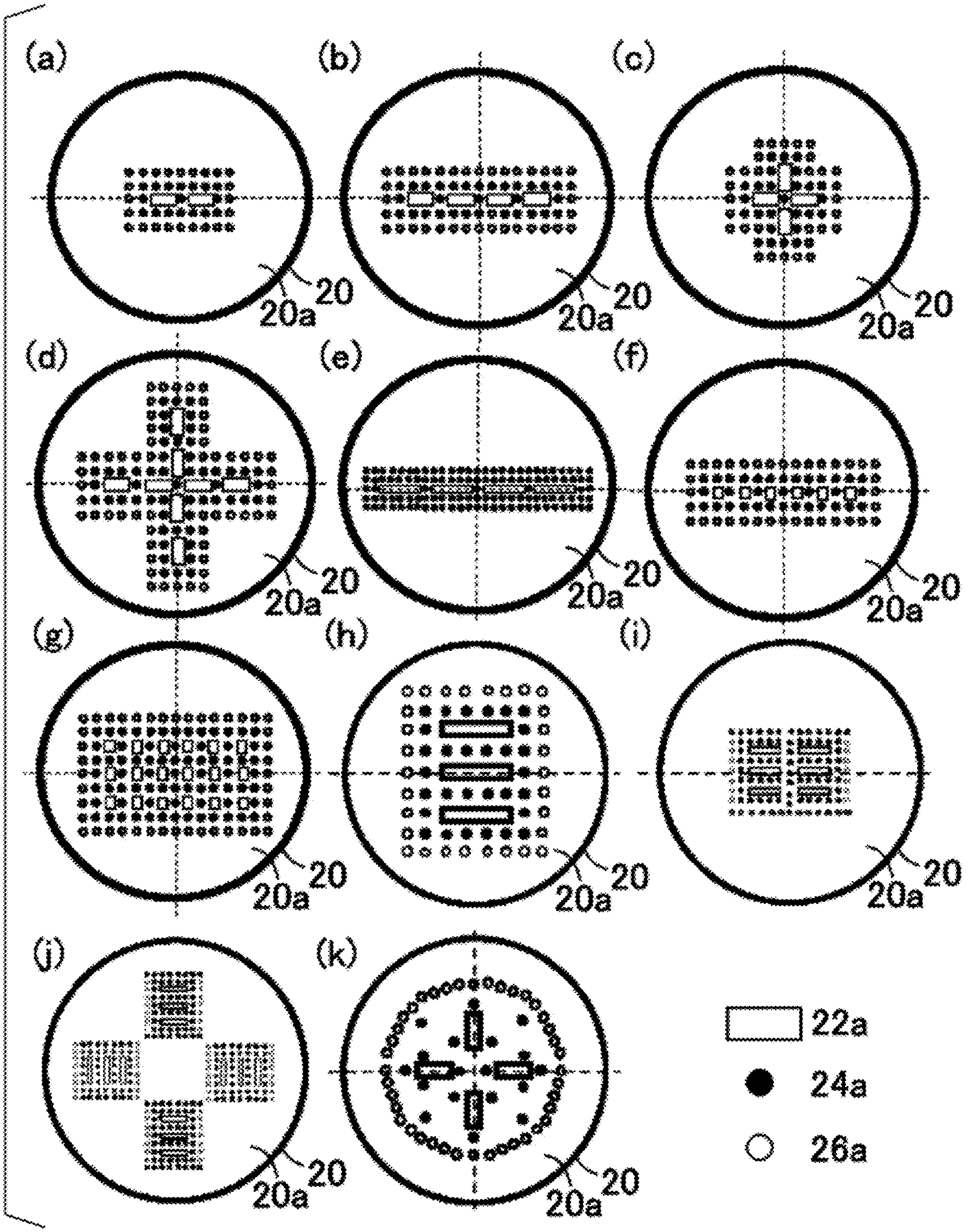
FIG. 5 shows schematic plan views illustrating preferred examples of the gas supply module according to the present invention.

FIG. 5 shows preferred examples of nozzle surfaces of the gas supply module according to the present invention. Specifically, FIG. 5 shows 11 examples (a) to (k) as arrangement examples of distal portions (openings) 22*a* of plasma nozzles 22, openings 24*a* of raw material nozzles 24, and openings 26*a* of inclusion gas nozzles 26 on the nozzle surface 20*a*. All of these examples have a configuration in which a plurality of distal portions 22*a*, in these examples, 2 to 18 portions, of plasma nozzles 22 are arranged on the nozzle surface 20*a*, openings 24*a* of raw material nozzles 24 are respectively arranged corresponding to those openings, and a plurality of openings 26*a* of inclusion gas nozzles 26 are arranged around the outside of the openings 24*a* of the raw material nozzles 24 at predetermined intervals. Here, the shape, size, number, and arrangement of the openings of the nozzles can be appropriately designed, in consideration of control of film formation of a nitrogen compound on the substrate 5 as described above. For example, these can be designed in consideration of control of the amount per unit time of nitrogen-based active species and raw material gas and control of a mixing state of the supplied substances. The active species is a radical or a free radical, and may mean an atom, molecule, or ion in a highly reactive state.

Hereinafter, examples will be shown in which quadrangular cross sections are provided as the shapes of the distal portions (openings) 22*a* of the plasma nozzles 22. However, also in these examples, round and other different shapes can be appropriately adopted from the viewpoint of controlling film formation on the substrate 5 in consideration of various mechanisms of the plasma source 21. As described above, in the production apparatus of the present invention, it is preferable to provide a plurality of openings of raw material nozzles corresponding to one opening of a plasma nozzle. It is also preferable to provide a plurality of openings of inclusion gas nozzles to surround the plurality of the openings of the raw material nozzles. In the production apparatus of the present invention, it is also preferable to provide a plurality of openings of plasma nozzles as necessary.

In (a) shown in FIG. 5, two distal portions 22*a* (openings) of plasma nozzles 22 having a rectangular cross section are arranged side by side in series on a straight line passing through the central portion of the circular nozzle surface 20*a*. Furthermore, a plurality of openings 24*a* of raw material nozzles 24 having a round cross section are arranged side by side at equal intervals around the distal portions 22*a*, specifically, on quadrangular lines that are the outer peripheries of the respective distal portions 22*a*. Furthermore, a plurality of openings 26*a* of inclusion gas nozzles 26 having a round cross section are arranged side by side at equal intervals on a quadrangular line that is the outer periphery of the plurality of those openings 24*a*.

Similarly, in (b) shown in FIG. 5, four distal portions 22*a* (openings) of plasma nozzles 22 having a rectangular cross section are arranged side by side in series on a straight line passing through the central portion of the nozzle surface 20*a*. Similarly to (a) shown in FIG. 5, a plurality of openings 24*a* of raw material nozzles 24 having a round cross section are arranged side by side at equal intervals on quadrangular lines that are the outer peripheries of the respective distal portions 22*a* of the plasma nozzles 22. Furthermore, a plurality of openings 26*a* of inclusion gas nozzles 26 having a round cross section are arranged side by side at equal intervals on a quadrangular line that is the outer periphery thereof.

As another example, in (c) shown in FIG. 5, four distal portions 22*a* (openings) of plasma nozzles 22 having a rectangular cross section are arranged on cross straight lines passing through the central portion of the nozzle surface 20*a*. Furthermore, a plurality of openings 24*a* of raw material nozzles 24 having a round cross section are arranged at equal intervals around the outside of the distal portions 22*a*. A plurality of openings 26*a* of inclusion gas nozzles 26 having a round cross section are arranged at equal intervals around the outside of the openings 24*a*.

In addition, in (d) shown in FIG. 5, eight distal portions 22*a* (openings) of plasma nozzles 22 having a rectangular cross section are arranged on cross straight lines passing through the central portion of the nozzle surface 20*a*. Furthermore, a plurality of openings 24*a* of raw material nozzles 24 having a round cross section are arranged at equal intervals around the outside of the distal portions 22*a*. A plurality of openings 26*a* of inclusion gas nozzles 26 having a round cross section are arranged at equal intervals around the outside of the openings 24*a*.

In (e) shown in FIG. 5, four distal portions 22*a* of plasma nozzles 22 having a rectangular cross section are arranged in series on a straight line passing through the central portion of the nozzle surface 20*a*. As compared with (b) and the like shown in FIG. 5, the number of the openings 24*a* of the raw material nozzles 24 and the number of openings 26*a* of the inclusion gas nozzles 26 are furthermore increased with respect to that of the distal portions 22*a* (openings) of the plasma nozzles 22.

In (f) shown in FIG. 5, six distal portions 22*a* (openings) of plasma nozzles 22 having a square cross section are arranged in series on a straight line passing through the central portion of the nozzle surface 20*a*. As compared with (b) and the like shown in FIG. 5, the opening area of the distal portions 22*a* of the plasma nozzles 22 is furthermore reduced.

In addition, in (g) shown in FIG. 5, the number of rows in which distal portions 22*a* of plasma nozzles 22 having a square cross section are lined up and the number of rows in which openings 24*a* of raw material nozzles 24 are lined up are increased as compared with (f) shown in FIG. 5. Furthermore, a plurality of openings 26*a* of inclusion gas nozzles 26 are arranged on a quadrangular line that is the outer periphery of those openings.

In (h) shown in FIG. 5, three distal portions 22*a* (openings) of plasma nozzles 22 having a rectangular cross section are arranged in parallel in a direction perpendicular to a straight line passing through the central portion of the nozzle surface 20*a*. Furthermore, a plurality of openings 24*a* of raw material nozzles 24 having a round cross section are arranged side by side at equal intervals on quadrangular lines that are the outer peripheries of the respective distal portions 22*a* (openings). Furthermore, a plurality of openings 26*a* of inclusion gas nozzles 26 having a round cross section are arranged side by side at equal intervals on a quadrangular line that is the outer periphery of the plurality of those openings 24*a*.

In (i) shown in FIG. 5, six distal portions 22*a* (openings) of plasma nozzles 22 having a rectangular cross section are arranged in parallel to be arranged on the straight line passing through the central portion of the nozzle surface 20*a* and arranged in a direction perpendicular to the straight line. Furthermore, a plurality of openings 24*a* of raw material nozzles 24 having a round cross section are arranged side by side at equal intervals on quadrangular lines that are the outer periphery of the respective distal portions 22*a*. Furthermore, a plurality of openings 26*a* of inclusion gas nozzles 26 having a round cross section are arranged side by side at equal intervals on a quadrangular line that is the outer periphery of the plurality of those openings 24*a*.

In (j) shown in FIG. 5, each nozzle arrangement provided in (h) shown in FIG. 5 is regarded as one unit (set), and four units (sets) are arranged in the nozzle surface 20*a*.

In (k) shown in FIG. 5, four distal portions 22*a* (openings) of plasma nozzles 22 having a rectangular cross section are arranged on cross straight lines passing through the central portion of the nozzle surface 20*a*. Furthermore, a plurality of openings 24*a* of raw material nozzles 24 having a round cross section are arranged around the outside of the distal portions 22*a*. A plurality of openings 26*a* of inclusion gas nozzles 26 having a round cross section are arranged side by side around the outside of the openings 24*a*. In this example, the openings 26*a* are arranged in a circle to entirely surround the plurality of openings 24*a*. The opening intervals of the nozzles may not be equally spaced, but are preferably arranged with a certain regularity.

Figure 6:
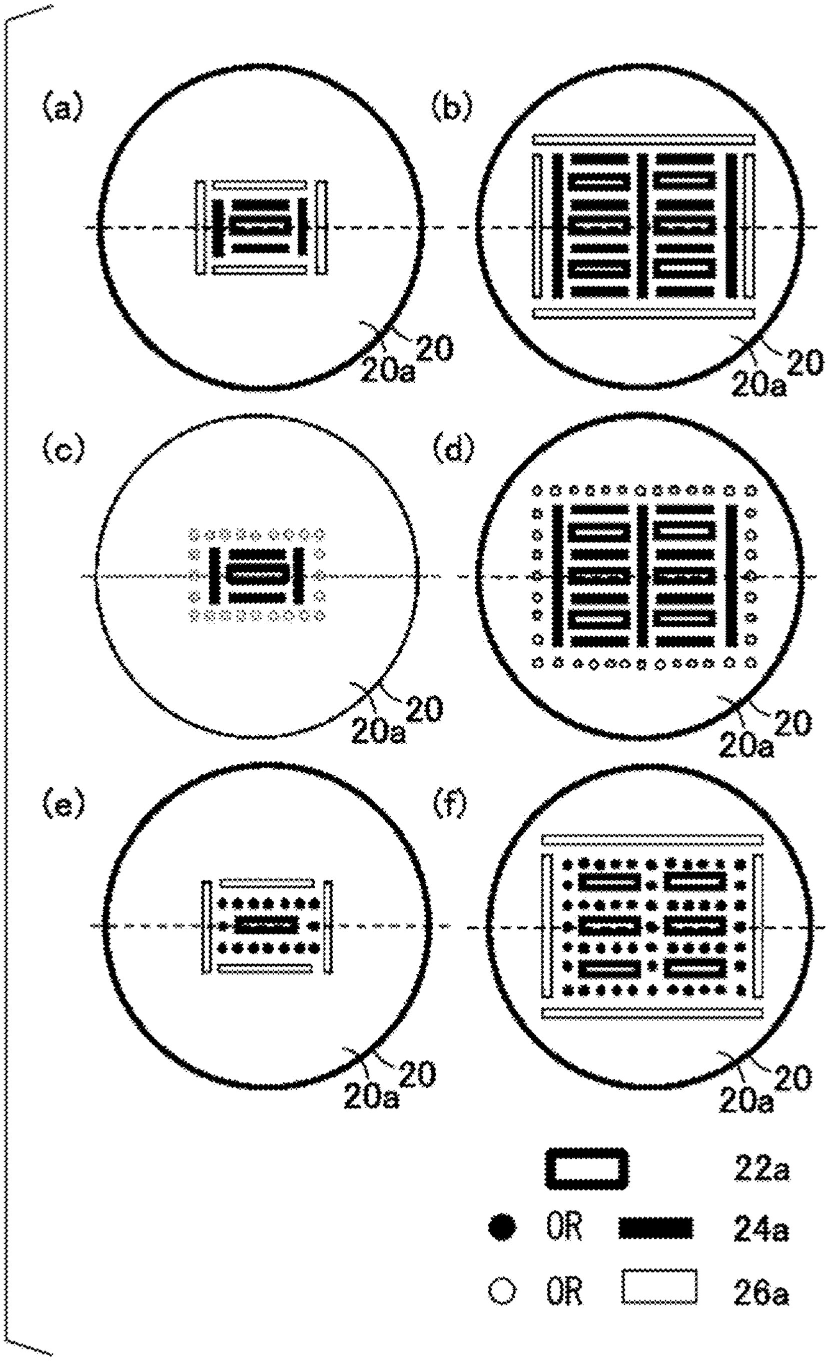
FIG. 6 shows schematic plan views illustrating preferred examples of a nozzle surface of the gas supply module according to the present invention.

FIG. 6 shows examples of arrangements in which the shapes and the like of the openings 24*a* of the raw material nozzles 24 and the openings 26*a* of the inclusion gas nozzles 26 on the nozzle surface 20*a* are changed as compared with FIG. 5.

In (a) shown in FIG. 6, a distal portion 22*a* (opening) of a plasma nozzle 22 having a rectangular cross section is placed on a straight line passing through the central portion of the nozzle surface 20*a*. Furthermore, a plurality of openings 24*a* of raw material nozzles 24 having a rectangular cross section are arranged on a quadrangular line that is the outer periphery of the distal portion 22*a*. Furthermore, a plurality of openings 26*a* of inclusion gas nozzles 26 having a rectangular cross section are arranged on a quadrangular line that is the outer periphery of the plurality of those openings 24*a*.

In (b) shown in FIG. 6, six distal portions 22*a* (openings) of plasma nozzles 22 having a rectangular cross section are arranged to be arranged on the straight line passing through the central portion of the nozzle surface 20*a* and arranged in a direction perpendicular to the straight line. Furthermore, a plurality of openings 24*a* of raw material nozzles 24 having a rectangular cross section are arranged on a quadrangular lines that are the outer peripheries of the respective distal portions 22*a*. As shown in (b), the openings 24*a* may include a plurality of types of openings having different sizes and/or shapes. Furthermore, a plurality of openings 26*a* of inclusion gas nozzles 26 having a rectangular cross section are arranged on a quadrangular line that is the outer periphery of the plurality of those openings 24*a*.

In (c) shown in FIG. 6, a distal portion 22*a* of a plasma nozzle 22 having a rectangular cross section is placed on a straight line passing through the central portion of the nozzle surface 20*a*. Furthermore, four openings 24*a* of raw material nozzles 24 having a rectangular cross section are arranged on a quadrangular line that is the outer periphery of the distal portion 22*a*. Furthermore, a plurality of openings 26*a* of inclusion gas nozzles 26 having a round cross section are arranged side by side at equal intervals on a quadrangular line that is the outer periphery of the plurality of those openings 24*a*.

In (d) shown in FIG. 6, six distal portions 22*a* (openings) of plasma nozzles 22 having a rectangular cross section are arranged such that they are arranged on the straight line passing through the central portion of the nozzle surface 20*a* and arranged in a direction perpendicular to the straight line. Furthermore, a plurality of openings 24*a* of raw material nozzles 24 having a rectangular cross section are arranged on quadrangular lines that are the outer peripheries of the distal portions 22*a*. Furthermore, a plurality of openings 26*a* of inclusion gas nozzles 26 having a round cross section are arranged side by side at equal intervals on a quadrangular line that is the outer periphery of the plurality of those openings 24*a*.

In (e) shown in FIG. 6, one distal portion 22*a* of a plasma nozzle 22 having a rectangular cross section is placed on a straight line passing through the central portion of the nozzle surface 20*a*. Furthermore, a plurality of openings 24*a* of raw material nozzles 24 having a round cross section are arranged side by side at equal intervals on a quadrangular line that is the outer periphery of the distal portion 22*a*. Furthermore, four openings 26*a* of inclusion gas nozzles 26 having a rectangular cross section are arranged on a quadrangular line that is the outer periphery of the plurality of those openings 24*a*.

In (f) shown in FIG. 6, distal portions 22*a* of plasma nozzles 22 having a rectangular cross section are arranged on the straight line passing through the central portion of the nozzle surface 20*a* and arranged in a direction perpendicular to the straight line. Furthermore, a plurality of openings 24*a* of raw material nozzles 24 having a round cross section are arranged side by side at equal intervals on quadrangular lines that are the outer peripheries of the distal portions 22*a*. Furthermore, four openings 26*a* of inclusion gas nozzles 26 having a rectangular cross section are arranged on a quadrangular line that is the outer periphery of the plurality of those openings 24*a*.

The protruding or retracted height position of the distal portions 22*a* of the plasma nozzles 22, the openings 24*a* of the raw material nozzles 24, and the openings 26*a* of the inclusion gas nozzles 26 with respect to the nozzle surface 20*a* can be appropriately adjusted, depending on the state of film formation of a nitrogen compound on the substrate 5. That is, when installing the raw material nozzles 24 and the inclusion gas nozzles 26 in the gas supply module 20, the angle, opening area, position, and the like of the nozzles are preferably adjusted in consideration of the flow rate of raw material gases and the direction of the flow of these gases that hit the surface of the substrate 5, and as a result, surface uniformity and film quality of a nitride compound formed on the substrate 5 can be controlled. For example, the distal portions 22*a* of the plasma nozzles 22 may protrude or be retracted from the nozzle surface 20*a*, and the distance between the distal portions 22*a* and the nozzle surface 20*a* may be, for example, 0 to +10 mm, 0 to −10 mm, or −10 to −50 mm. Regarding the above-described numerical values, a positive value indicates that a distal portion is protruding, and a negative value indicates that a distal portion is retracted.

When the above-described apparatus 1 for producing a nitrogen compound is used, it is possible to produce a high-quality nitrogen compound, for example, which has few defects, even if the temperature of the substrate 5 during production of a nitrogen compound becomes lower than that of the conventional art, for example, the temperature thereof becomes 300° C. to 800° C., more specifically, 400° C. to 750° C., after a pressure of 1 kPa or higher is applied in the container 10, for example, after making the pressure in the container 10 1 kPa or higher. In other words, a film can be formed by increasing the pressure so that the mean free path of ions in a plasma becomes smaller than the Debye length. Therefore, a high-quality thin film can be obtained from a nitrogen compound which is made of any Group III-V compound, such as GaN, InGaN, InN, AlN, or a mixed composition thereof.

As described above, a raw material gas can be reacted with nitrogen radicals in the method and apparatus of the present invention, such that a pressure inside a container, which houses a substrate and a gas supply module, is set to 1 kPa or higher. For example, the pressure is generally 0.1 to 100 kPa, but is not limited to these examples. Specific examples thereof include a pressure of 1 kPa to 10 kPa.

In the method and apparatus of the present invention, the temperature of a substrate which is placed in a container can be arbitrarily selected. For example, a film can be preferably produced at the temperature of 300° C. to 800° C.

According to the method and apparatus of the present invention, in a case of providing a nitrogen compound containing In, it is possible to obtain a nitrogen compound thin film which contains a large amount of In and has significantly good crystallinity. Examples of the amount of In in the film include 25% to 45%, 45% to 75%, and 75% to 100%, but there is no limitation to only these examples.

In the production method and apparatus of the present invention, the nitrogen atom density required for forming a nitrogen compound thin film can be set to $1\times10^{14}$ $cm^{-3}$ or more at the position of a substrate. The nitrogen atom density required for forming a film in the production method or apparatus of the present invention is, for example, $1\times10^{13}$ $cm^{-3}$ to $1\times10^{16}$ $cm^{-3}$, preferably $1\times10^{13}$ $cm^{-3}$ to $1\times10^{15}$ $cm^{-3}$, and more preferably $1\times10^{14}$ $cm^{-3}$ to $1\times10^{15}$ $cm^{-3}$. Specific examples of the nitrogen atom density may include $1\times10^{13}$ $cm^{-3}$ to $1\times10^{14}$ $cm^{-3}$, $1\times10^{14}$ $cm^{-3}$ to $1\times10^{15}$ $cm^{-3}$, or $1\times10^{15}$ $cm^{-3}$ to $1\times10^{16}$ $cm^{-3}$.

The above-described method of the present invention is suitable for forming a thin film of nitrogen compound such as silicon nitride made of silicon and nitrogen. In addition, by adding an additive to a raw material gas, it is possible to form a film of a nitrogen compound doped with an element derived from the additive. For example, magnesium is considered as an additive.

Examples (Test Before Film Formation)

Figure 7:
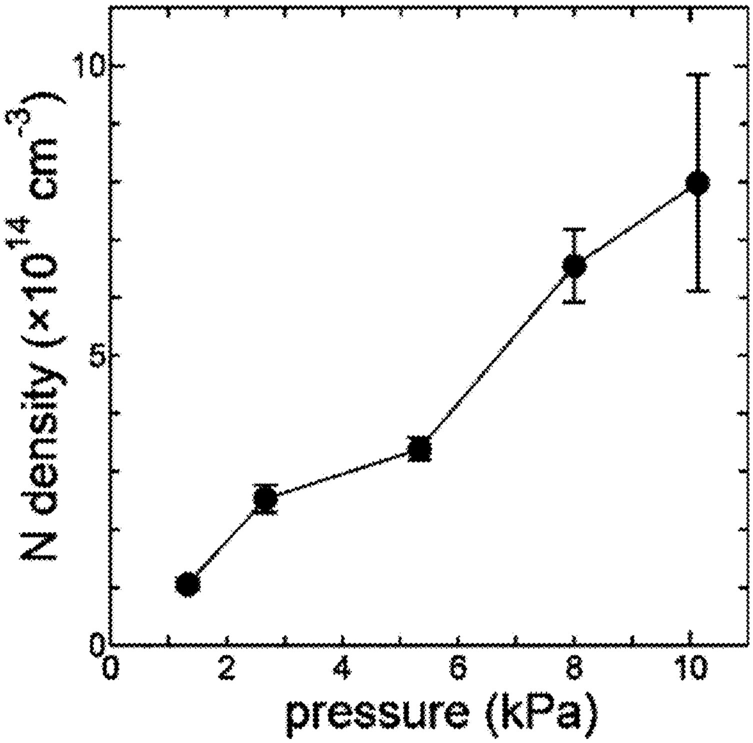
FIG. 7 is a graph illustrating dependence of nitrogen atom density on pressure within a vacuum container.

First, nitrogen atom densities obtained in the vacuum container 10 were measured using the apparatus shown in FIGS. 1 and 2 with a flat nozzle surface 20, and the results were shown in FIG. 7. Specifically, the size (cross section) of the slit-shaped distal portion 22*a* of the plasma nozzle 22 of the plasma source 21 was made into a slit-shaped rectangle with a width of 40 mm and a gap of 0.2 mm. The diameter of the nozzle surface 20*a* was 181 mm. The number of the openings 24*a* of the raw material nozzles 24 was 16, the diameter of the openings was 2.5 mm, the number of openings 26*a* of the inclusion gas nozzles 26 was 24, and the diameter of the openings was 2.5 mm. In addition, the center of the nozzle surface 20*a* is flat as described above. Nitrogen gas was introduced into the plasma source 21 at a rate of 2 L/min as a plasma source gas, and 110 W microwaves were applied thereto as continuous waves. In this measurement, a raw material gas and an inclusion gas were not flowed. In addition, the nitrogen atom density of a circular area having a diameter of 10 mm, which was directly under the distal portion 22*a* of the plasma nozzle 22 and corresponds to the central portion of a region R shown in FIG. 8, was measured using a vacuum ultraviolet absorption spectroscopy system (refer to Chen, S., et al., Behaviors of Absolute Densities of N, H, and $NH_3$ at Remote Region of High-Density Radical Source Employing $N_2$—$H_2$ Mixture Plasmas. Jpn. J. Appl. Phys. 50, 01AE03 (2011)) which was incorporated as the spectroscopy system 40. This measurement was performed in a state where the substrate 5 and the susceptor system 50 were not installed.

FIG. 7 shows results of measuring pressure dependence of nitrogen atom density which was measured without placing the substrate 5, at a position of the substrate 5 within the vacuum container 10. It can be seen that, in the above-described configuration, the nitrogen atom density can be increased from $1\times10^{14}$ $cm^{-3}$ to nearly $1\times10^{15}$ $cm^{-3}$ while increasing the pressure inside the vacuum container 10 from 1 kPa to 10 kPa.

In this manner, in the production method of the present invention, the nitrogen atom density at the position of the substrate can be set to $1\times10^{14}$ $cm^{-3}$ or more.

(Film Formation Test 1)

Next, using the apparatus shown in FIGS. 1 and 2, an indium nitride film was formed under conditions as follows (Film Formation Test 1). First, a substrate (size: 2 inches) made of gallium nitride was placed on the susceptor 51 as the substrate 5. The height of the susceptor system 50 was adjusted so that the distance between the distal portion 22*a* of the plasma nozzle 22 and the substrate 5 was 10 mm. The sizes and shapes of the openings were the same as those described above. The plasma source 21 is attached to the gas supply module 20 so that the distal portion 22*a* of the plasma nozzle 22 protrudes by 0.1 mm from the nozzle surface 20*a*. Then, nitrogen gas was introduced into the plasma source 21 as a plasma source gas at a rate of 2 L/min, and a microwave of 90 W was applied thereto. Then, trimethyl indium (TMI) gas as a Group III gas was introduced from the raw material nozzles 24 at a rate of 3.5 L/min together with nitrogen gas which was used as a carrier. In addition, nitrogen gas was introduced from the inclusion gas nozzles 26 at a rate of 1 L/min. The pressure inside the vacuum container 10 was kept at 2.0 kPa using a pressure regulating valve, and the temperature of the substrate was set to 650° C. using the susceptor system 50 on which the substrate 5 was provided. The substrate rotation speed was 5 rpm. The temperature of the substrate is a value obtained by measuring the temperature of a portion of the susceptor immediately below the substrate.

Figure 8:
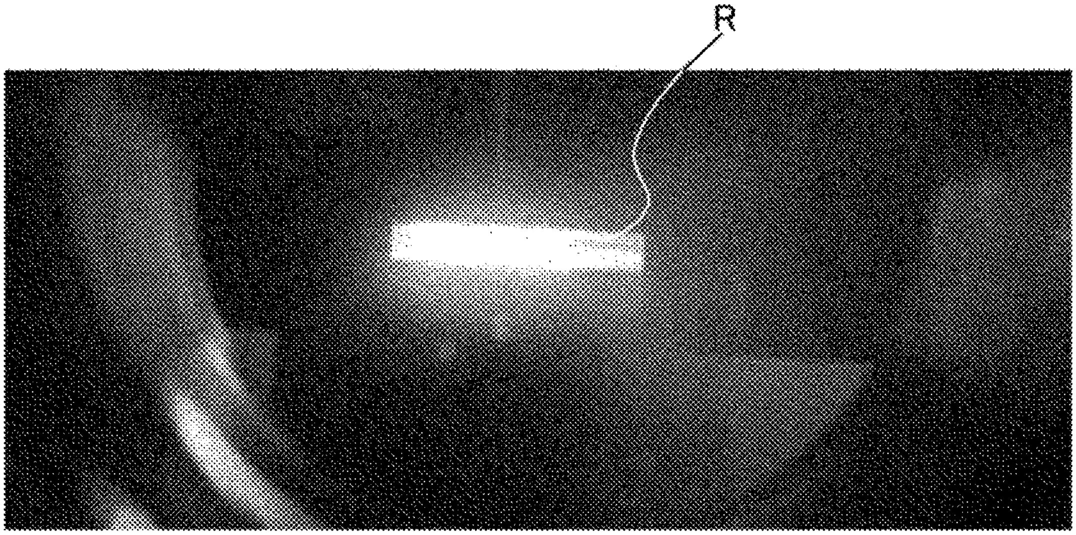
FIG. 8 is a photograph showing a state of emission between a plasma source and a substrate.

FIG. 8 shows an emission state in a light emitting part R (refer to FIG. 1), which is located between the substrate 5 and the distal portion 22*a* of the plasma nozzle 22 in the vacuum container 10, in Film Formation Test 1.

Figure 9:
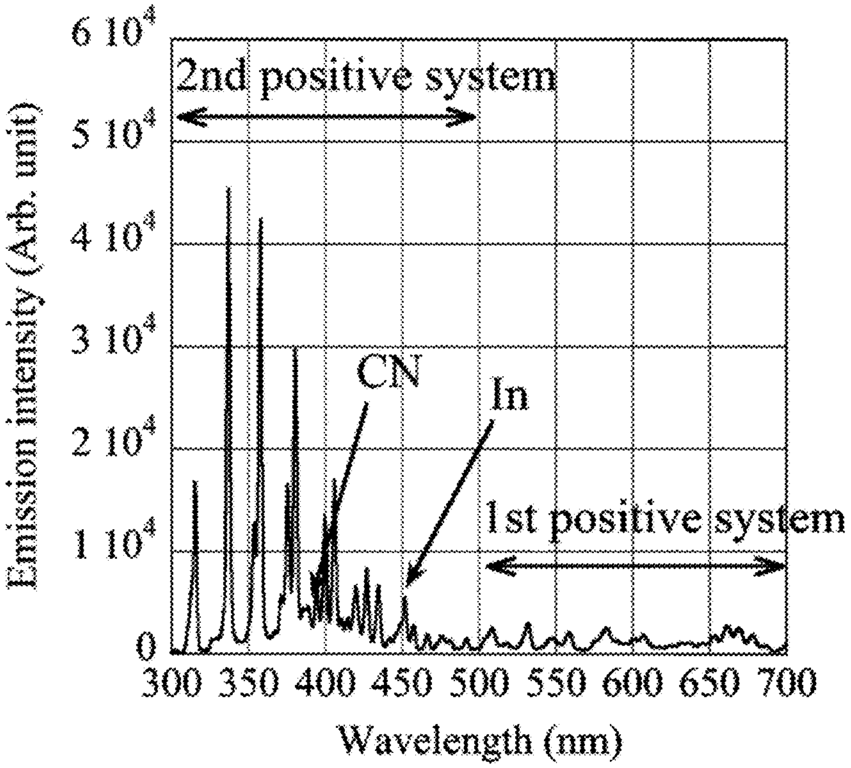
FIG. 9 is a graph of spectral intensity of a light emitting part measured with a visible spectrometer.

In addition, FIG. 9 shows results of measuring light, which was obtained from the light emitting part R in Film Formation Test 1, using the spectroscopy system 40 (manufactured by StellarNet Inc., fiber multi-channel compact spectrometer, Blue-Wave-UVNb). An emission spectrum group of nitrogen molecules, an emission spectrum of a CN molecular band (to 388 nm), and an emission spectrum In I of In atoms [In $5s^26s$ ($^2s$)→In $5s^25p$ ($^2p$), 451.13 nm] were measured. In particular, in the emission spectrum group of nitrogen molecules, emission peak values of the 2nd positive system was about one or more orders of magnitude higher than emission peak values of the 1st positive system. The 1st positive system means an emission spectrum group around 500 to 800 nm, and the 2nd positive system means an emission spectrum group around 300 to 500 nm.

Figure 10:
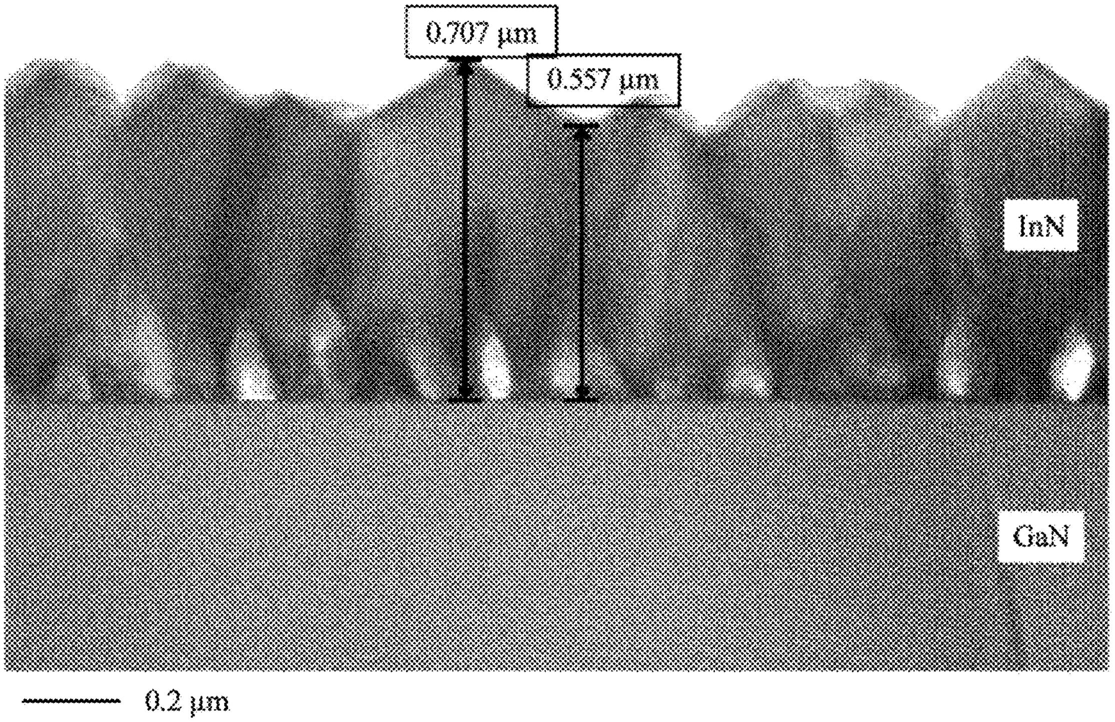
FIG. 10 is a transmission electron micrograph of a cross section of single-crystal indium nitride on gallium nitride.

FIG. 10 shows a photograph obtained by observing a cross section of the indium nitride film, which was formed and grown for 122 minutes in Film Formation Test 1, using a transmission electron microscope (manufactured by Hitachi, Ltd., H-9000UHR) (103000×). Single-crystal indium nitride having a thickness of about 700 nm was formed on the substrate, and the defect density was as low as up to $3\times10^9$ $cm^{-2}$, and therefore the results indicate that the obtained film was of high quality. The thicker the film thickness, the higher the quality tended to be.

Figure 11:
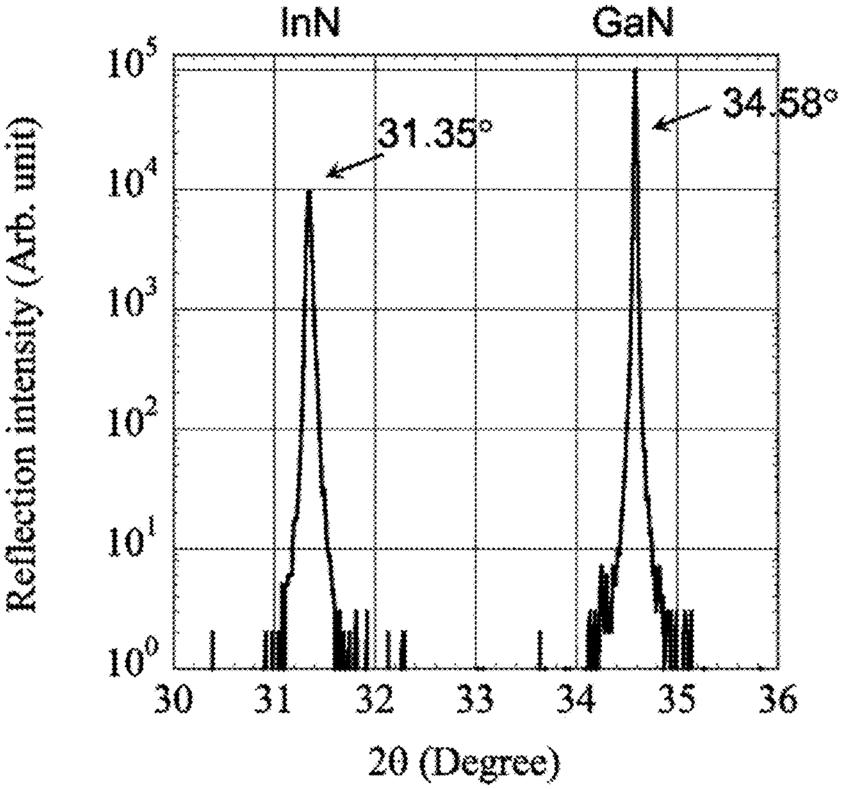
FIG. 11 is an ω-2θ scan diffraction intensity distribution diagram of a single-crystal indium nitride film measured through an X-ray diffraction method.

FIG. 11 shows measurement results of the single-crystal indium nitride film shown in FIG. 10, with respect to X-ray diffraction (XRD) (X'Pert MRD manufactured by Malvern Panalytical Ltd.). No signal derived from metal indium at 33 degrees was observed, but a signal of indium nitride, which appeared at a position of 31.35 degrees with a narrow spectrum width, was measured. In other words, the formed indium nitride film has no precipitation of indium metal, and the results indicates favorable crystallinity. In addition, a signal derived from gallium nitride of the substrate was observed at a position of 34.58 degrees.

Figure 12:
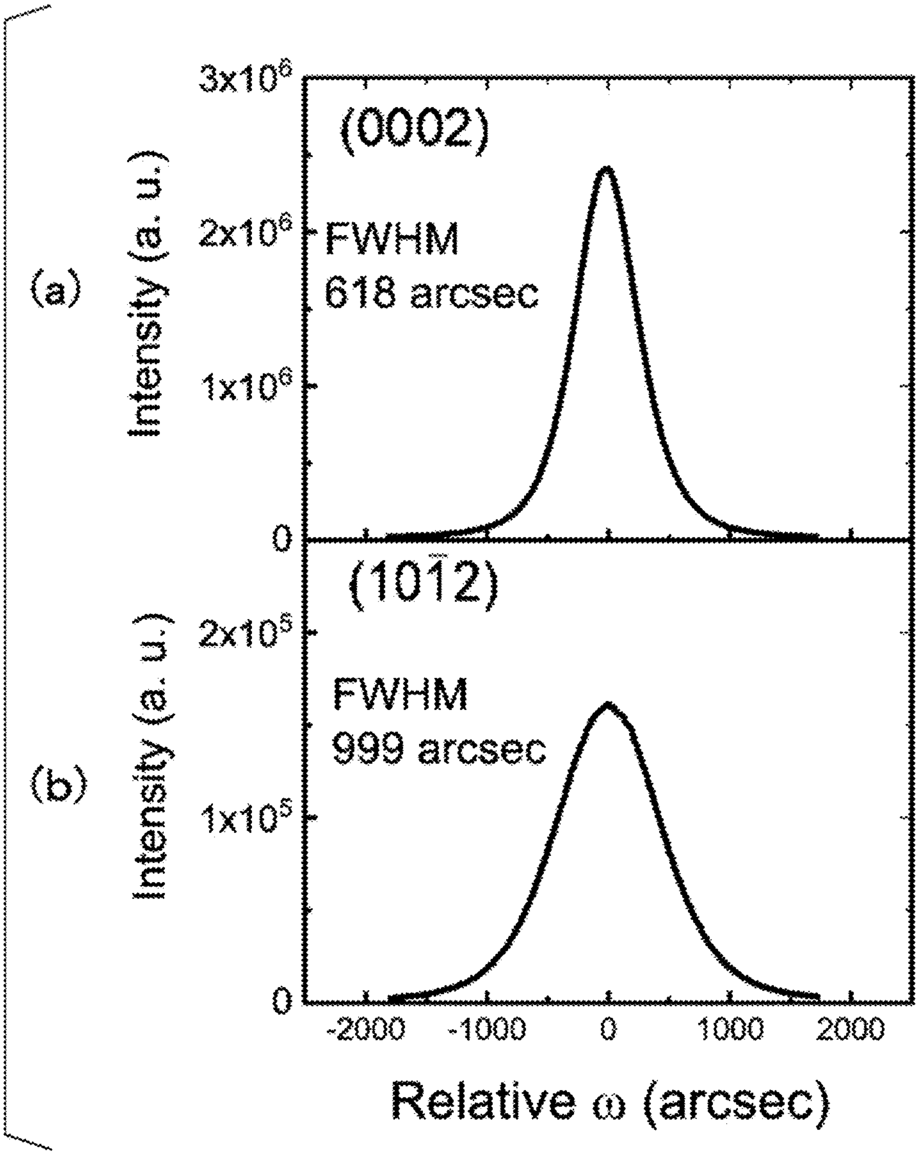
FIG. 12 shows graphs of intensity distribution of a single-crystal indium nitride film through an X-ray rocking curve method.

FIG. 12 shows measurement results of the single-crystal indium nitride film shown in FIG. 10, wherein an X-ray rocking curve (XRC) method is used. Here, (a) is a signal of the (0002) symmetric plane, and (b) is a signal of the (10-12) asymmetric plane. The crystal orientation is indicated as a Miller index using parentheses, and when the index is negative, a minus sign is placed in front of the index. The full widths at half maximum of the (0002) symmetric plane in (a) and the (10-12) asymmetric plane in (b) are 618 arcsec and 999 arcsec, respectively. With respect to the aforementioned film, lattice constants determined from a reciprocal lattice space map were c=0.570635 nm and a=0.353008 nm.

In addition, a defect density D can be calculated by (full width at half maximum)$^2$/{9×(lattice constant$^2$)} (for the formula, refer to Zheng, X. H., et al., Determination of twist angle of in-plane mosaic spread of GaN films by high-resolution X-ray diffraction, J. Cryst. Growth 255, 63-67 (2003)). According to this, the screw dislocation defect density is $0.306\times10^9$ $cm^{-2}$, which is obtained from the half-width 618 arcsec using the lattice constant c.

On the other hand, the edge dislocation defect density is $2.089\times10^{9}$ $cm^{-2}$, which is obtained from the half-width 999 arcsec using the lattice constant a. The total dislocation defect density is $2.395\times10^{9}$ $cm^{-2}$, as it is the sum of the screw dislocation defect density and the edge dislocation defect density. This value is almost similar to the defect density value of $3\times10^{9}$ $cm^{-2}$, which was observed from the photograph obtained through transmission electron microscope observation in FIG. 9 described above, and the results indicate that the obtained film has favorable crystallinity.

Figure 13:
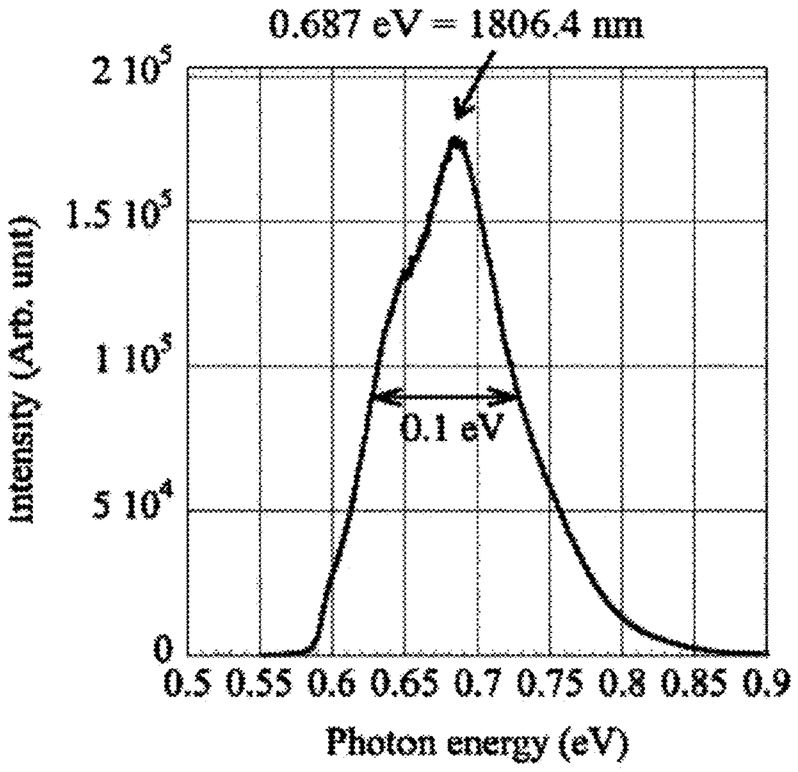
FIG. 13 is a spectral intensity distribution diagram of photoluminescence of a single-crystal indium nitride film measured at room temperature.

FIG. 13 shows a spectrum of photoluminescence (PL) of the single-crystal indium nitride film shown in FIG. 10, which was measured at room temperature. For the emission spectrum at a photon energy of 0.687 eV (at a wavelength of 1806.4 nm), a spectrum with a narrow half-width of 0.1 eV was obtained. Here, a PL measurement system manufactured by Photon Design Corporation was used for the measurements. In detail, the measurements were performed such that 647 nm excitation laser was outputted at 100 mW, a 1% optical filter was set, the laser beam diameter at the substrate portion was set to 1.2 μm, irradiation was performed at the power density of $8.9\times10^{4}$ $W/cm^{2}$, emission spectrum data is obtained using a 100× objective lens at an exposure time of 0.5 seconds, and the obtained data was integrated 10 times.

(Film Formation Test 2)

Next, using the apparatus shown in FIGS. 1 and 2, an indium gallium nitride film was formed under different conditions as described below (Film Formation Test 2). In Film Formation Test 2, a substrate, in which a GaN film was formed on a sapphire substrate, was used. The structural conditions of the apparatus were the same as those of Film Formation Test 1, except for those described below. Specifically, in the film formation of Film Formation Test 2, a part of the trimethyl indium (TMI) gas, which was used as the Group III gas in Film Formation Test 1 described above, was replaced with triethyl gallium (TEG) gas. An indium gallium nitride film was grown by the susceptor system 50, on which the substrate 5 was placed, for 30 minutes at a substrate temperature of 700° C. and a substrate rotation speed of 5 rpm.

Figure 14:
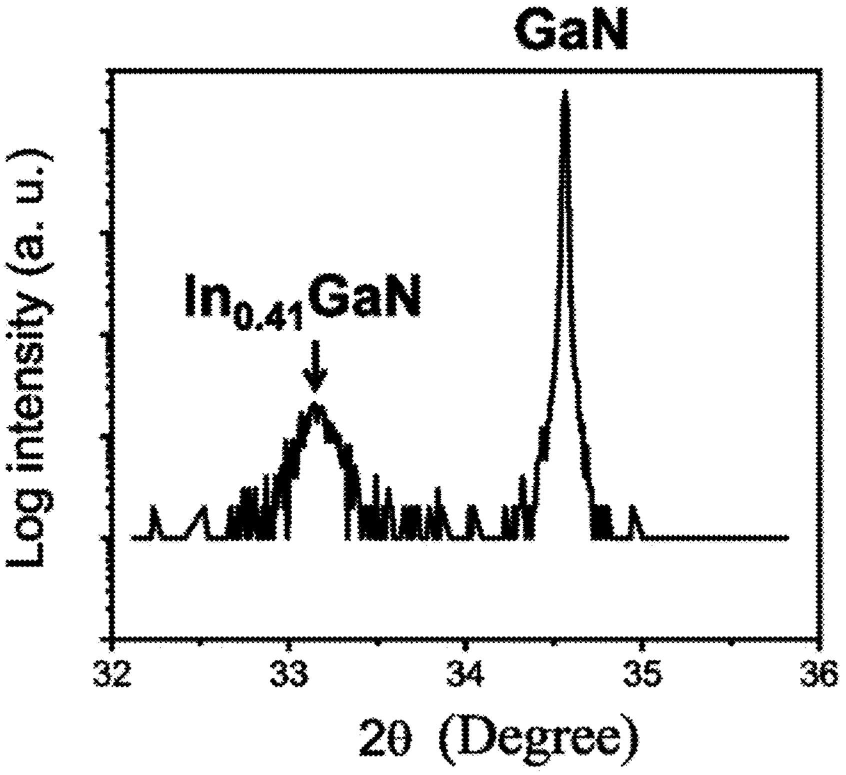
FIG. 14 is an ω-2θ scan diffraction intensity distribution diagram of a single-crystal indium gallium nitride film (In composition: 41%) measured through an X-ray diffraction method.

FIG. 14 shows the measurement results of XRD of the indium gallium nitride film, which was formed with a gas composition ratio {TMI/(TMI+TEG)} of 0.5 in Film Formation Test 2. As can be seen, the content of indium is 41%.

Figure 15:
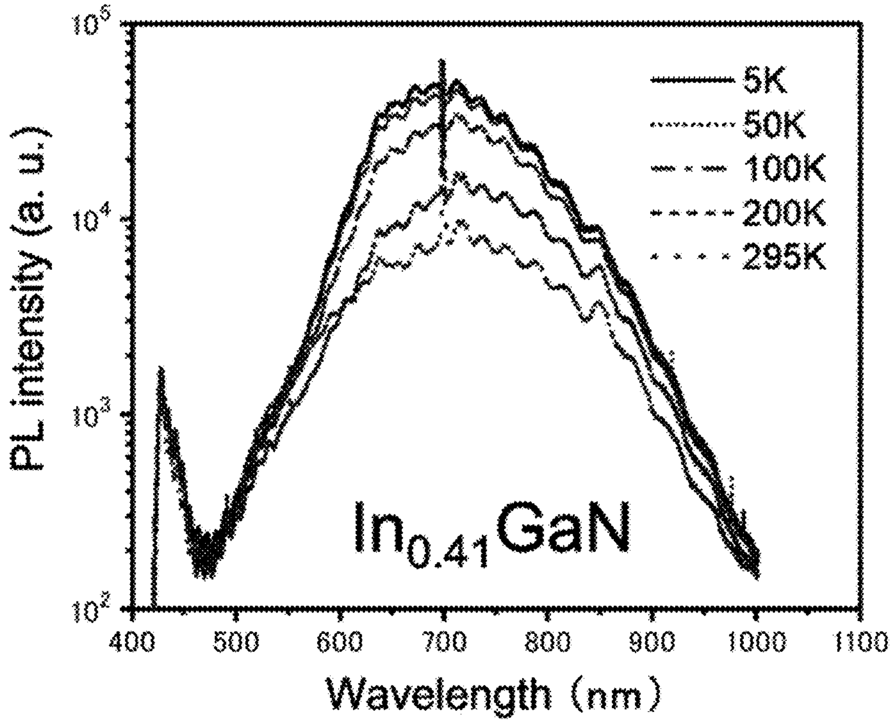
FIG. 15 is a graph showing temperature dependence of photoluminescence spectra of a single-crystal indium gallium nitride film (In composition: 41%) at 5 to 295 K.

FIG. 15 shows the temperature dependence of photoluminescence spectra of the indium gallium nitride film, which was used in the measurement results shown in FIG. 14, within a temperature range of 5 to 295 K. Here, the gas composition ratio {TMI/(TMI+TEG)} is 0.5. As can be seen from these results, an emission distribution with a peak at 700 nm was obtained. The emission lines around 700 nm are signals derived from chromium in the sapphire substrate. Here, the temperature of the substrate was controlled using a cryostat (manufactured by Montana Instruments Corporation), and irradiation was carried out using a laser of 375 nm wavelength (manufactured by Showa Optronics Co., Ltd.) as excitation light, at a laser power of 70 mW and using a focusing lens to narrow the laser beam diameter to 50 μm. Then, using a spectrometer and a CCD detector system (manufactured by Horiba, Ltd.), data were obtained such that exposure time was 0.5 seconds and integration times were five. Here, the CCD detector was cooled to minus 125° C. using liquid nitrogen.

Figure 16:
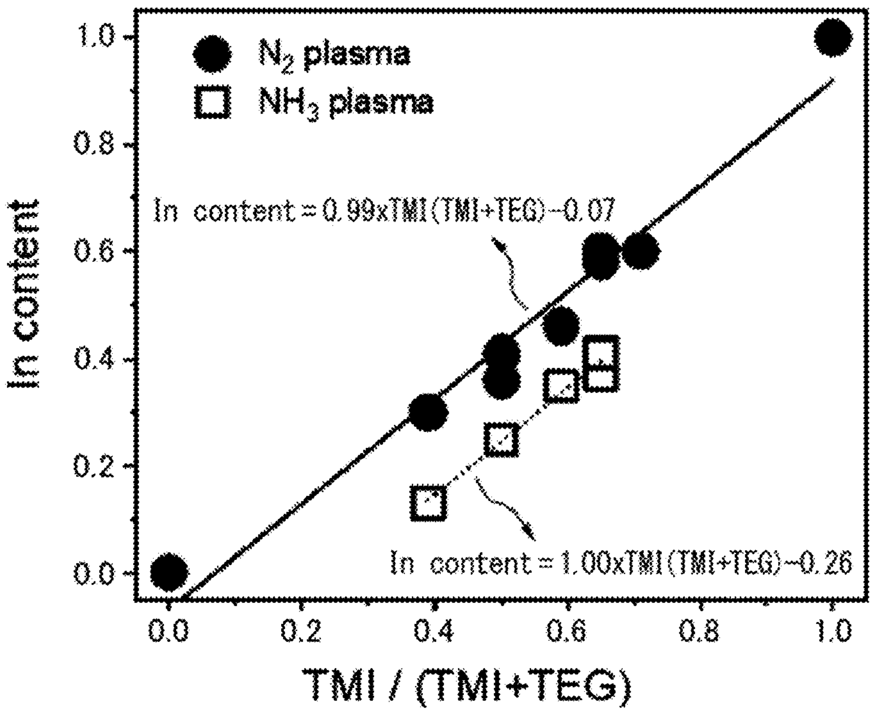
FIG. 16 is a graph showing a relationship between the indium content in a film and a gas composition ratio {TMI/(TMI+TEG)} of a raw material gas.

FIG. 16 shows measurement results of the In content in nitrogen compound films, wherein the films are formed by changing the gas composition ratio {TMI/(TMI+TEG)} between 0 and 1. In this graph, black circle marks indicate that nitrogen is used as a plasma source gas, and square marks indicate that ammonia is used as a plasma source gas.

Films in which In contents were varied from gallium nitride (GaN) to indium gallium nitride (InGaN) to indium nitride can be obtained, as can be seen from these results. In this graph, the amount of In was proportional to the gas composition ratio, as expressed by a relational expression 0.99×{TMI/(TMI+TEG)}-0.07 (refer to black circle marks). In general, the amount of In is considered to be expressed by a relational expression of ~0.25×{TMI/(TMI+TEG)}, and therefore, it can be seen that the results of this example are different from conventionally known general reactions.

Figure 17:
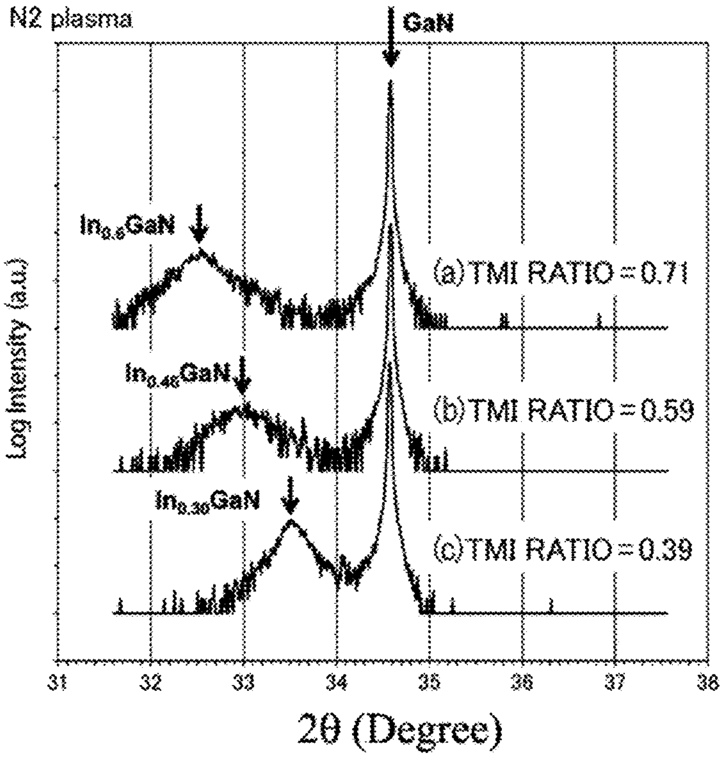
FIG. 17 is an ω-2θ scan diffraction intensity distribution diagram obtained by measuring a film, which is formed using nitrogen as a plasma source gas, through an X-ray diffraction method.

FIG. 17 shows ω-2θ curves, which is measured by XRD, of the nitrogen compound films whose measurement results are shown in FIG. 16, wherein the films are obtained when the composition ratio obtained by {TMI/(TMI+TEG)} is (a) 0.39, (b) 0.59, or (c) 0.71. This graph shows that InGaN films with different In contents are formed, and the graph indicates that the amount of In can be controlled by the composition ratio (mixing ratio) of the raw material gas.

(Film Formation Test 3)

Next, using the above-described apparatus shown in FIGS. 1 and 2, film formation was performed using different plasma source gases. Specifically, using ammonia as a plasma source gas instead of nitrogen gas in Film Formation Tests 1 and 2 described above, film formation of a gallium nitride film, an indium gallium nitride film, and an indium nitride film was carried out (Film Formation Test 3).

Figure 18:
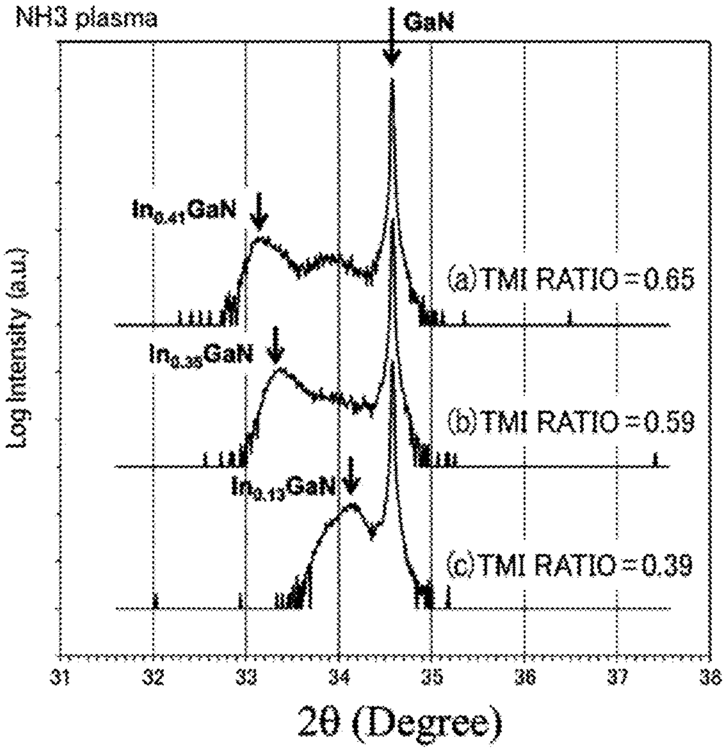
FIG. 18 is an ω-2θ scan diffraction intensity distribution diagram obtained by measuring a film, which is formed using ammonia as a plasma source gas, through an X-ray diffraction method.

FIG. 18 shows ω-2θ curves, which is measured by XRD, of the nitrogen compound films, the curves being obtained when the composition ratio obtained by {TMI/(TMI+TEG)} is (a) 0.39r, (b) 0.59, or (c) 0.65. Again, it is shown that InGaN films with different In contents are formed, and it indicates that the amount of In in the films can be controlled by the composition ratio (mixing ratio) of the raw material gas. The content of In is expressed by a relational expression of 1.00×{TMI/(TMI+TEG)}−0.26, and the content is shown in FIG. 16 (refer to white square mark).

(Film Formation Test 4)

Next, using the above-described apparatus shown in FIGS. 1 and 2, indium nitride films were formed under three different configuration conditions (different height positions of the distal portion 22*a* of the plasma nozzle 22) as follows (Film Formation Test 4). First, the substrate 5 made of gallium nitride was placed on the susceptor 51. The height of the susceptor system 50 was adjusted so that the distance between the substrate 5 and the distal portion 22*a* of the plasma nozzle 22 was 10 mm. Plasma source 21 was attached to the gas supply module 20, so that the distal portion 22*a* of the plasma nozzle 22 was made to protrude from the nozzle surface 20*a* by 0.1 mm (d=0.1 mm), to be recessed, that is, retracted therefrom by 10 mm (d=−10 mm), or to be recessed by 20 mm (d=−20 mm). Furthermore, nitrogen gas was introduced into each plasma source 21 as a plasma source gas at a rate of 2 L/min, and a microwave of 90 W was applied thereto. Then, trimethyl indium (TMI) gas as a Group III gas was introduced from the raw material nozzles 24 at a rate of 3.5 L/min together with nitrogen gas as a carrier. In addition, nitrogen gas was introduced from the inclusion gas nozzles 26 at a rate of 1 L/min. The pressure inside the vacuum container 10 was kept at 2.0 kPa using a pressure regulating valve, and the susceptor system 50 on which the substrate 5 was installed was used to set the temperature thereof to 650° C. The substrate rotation speed was 5 rpm, and the film formation time was 30 minutes.

Figure 19:
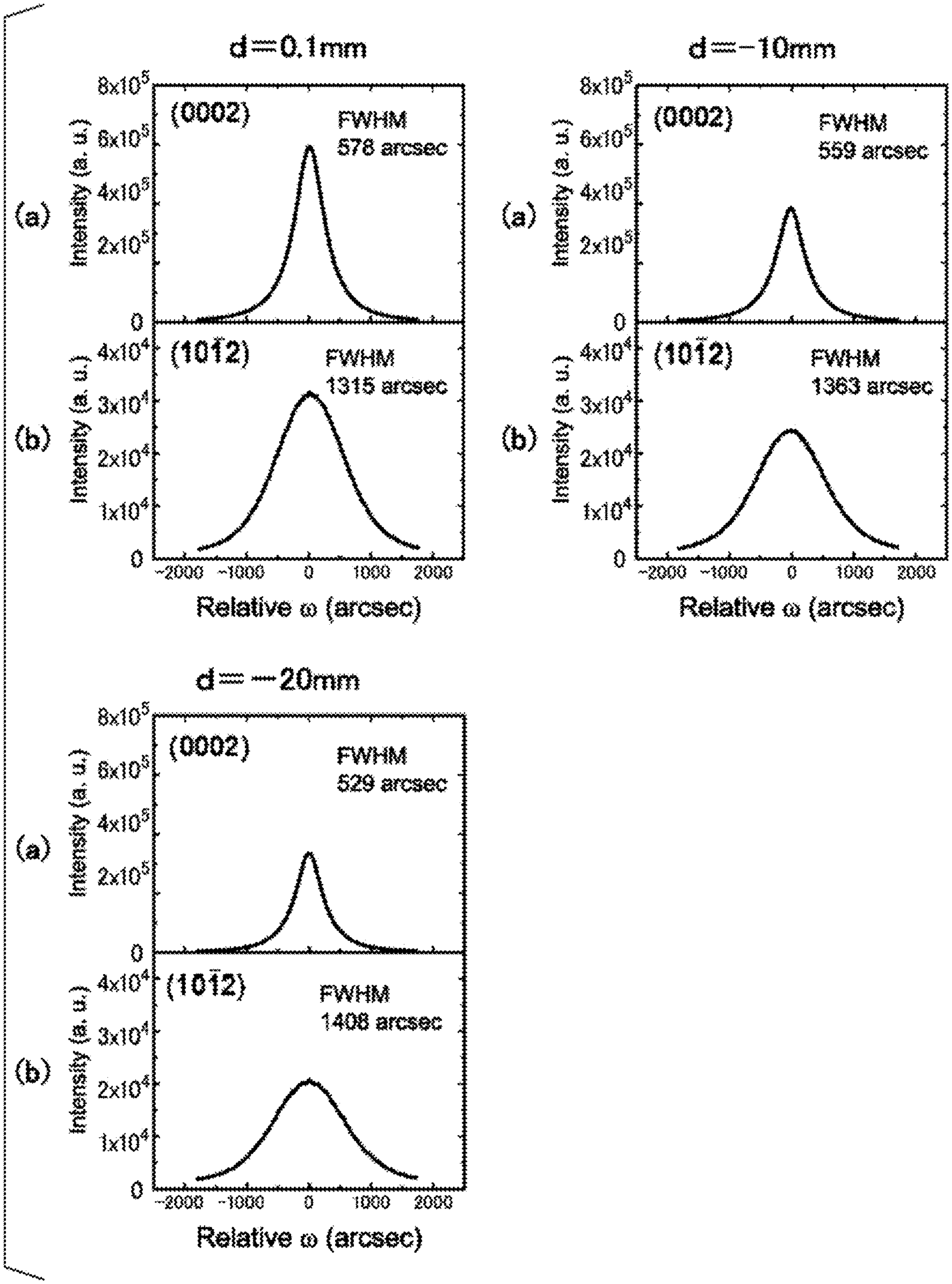
FIG. 19 shows graphs of intensity distribution of a single-crystal indium nitride film, which is formed by changing the position of a plasma nozzle, through an X-ray rocking curve method.

Similarly to FIG. 12, FIG. 19 shows measurement results of the single-crystal indium nitride films which are obtained in Film Formation Test 4, with respect to (a) the (0002) symmetric plane and (b) the (10-12) asymmetric plane, which are measured through an X-ray rocking curve (XRC) method.

In a case where d=0.1 mm, the full widths at half maximum of the (0002) symmetric plane and the (10-12) asymmetric plane in the measurement results were 578 arcsec and 1315 arcsec, respectively. In addition, in a case where d=−10 mm, they were 559 arcsec and 1363 arcsec, respectively. In a case where d=−20 mm, they were 529 arcsec and 1408 arcsec, respectively. The aforementioned values are all smaller than the full width at half maximum of the (0002) symmetric plane of (a) in FIG. 12, and the results indicate that the screw dislocation defect density becomes small. On the other hand, the aforementioned values are slightly larger than the full width at half maximum of the (10-12) asymmetric plane of (b) in FIG. 12, and the results indicate that the edge dislocation defect density becomes slightly large. In this way, it can be seen that, even when the position of the plasma source is changed, a high-quality film can be formed if it is controlled such that a sufficient amount of nitrogen atoms are supplied.

As described above, the density of a nitrogen-based active species and a raw material gas can be controlled independently to obtain a high-quality nitrogen compound, and a wide range of indium content can be controlled, when a gas supply module is used in which raw material gas discharge openings are provided around the outside of a plasma discharge opening.

Although a representative embodiment according to the present invention and modification examples based thereon have been described, the present invention is not necessarily limited thereto. Those skilled in the art will be able to find various alternative examples without departing from the scope of the appended claims.

INDUSTRIAL APPLICABILITY

The present invention can provide a method and apparatus for producing a nitrogen compound, which can generate a high-quality nitrogen compound thin film with high efficiency.

REFERENCE SIGNS LIST

1 Production apparatus
5 Substrate
10 Container (furnace body)
16 Cover
**16*a*** Hole portion of cover
20 Gas supply module
**20*a*** Nozzle surface
20' Head plate
21 Plasma source
22 Plasma nozzle
**22*a*** Distal portion of plasma nozzle
23 Dielectric substrate
24 Raw material nozzle
**24*a*** Opening of raw material nozzle
24' Raw material supply pipe
26 Inclusion gas nozzle
**26*a*** Opening of inclusion gas nozzle
26' Inclusion gas supply pipe
27 Gas supply path
28 Microstrip line of dielectric substrate
30 Power source
31 Coaxial cable
32 Stub tuner
34 Gas supply pipe
40 Spectroscopy system
50 Susceptor system
51 Susceptor
R Light emitting part

The invention claimed is:

1. A method for producing a nitrogen compound, wherein the method is performed through vapor phase growth using a gas supply module which has a nozzle surface which faces a substrate placed on a placement portion, wherein the method comprising:

converting a plasma source gas containing a nitrogen element into a plasma, and discharging the formed plasma toward the substrate from an opening of a plasma nozzle which is placed on the nozzle surface;

discharging a raw material gas from an opening of a raw material nozzle, wherein the opening of the raw material nozzle is arranged on the nozzle surface and around the outside of the opening of the plasma nozzle;

discharging an inclusion gas, which contains a Group V element, from an opening of an inclusion gas nozzle toward the substrate, wherein the opening of the inclusion gas nozzle is arranged around the outside of the opening of the raw material nozzle on the nozzle surface; and reacting an active species, which contains nitrogen and are contained in the discharged plasma, with the discharged raw material gas to form a nitrogen compound film on the substrate, wherein the inclusion gas is discharged from the opening of the inclusion gas nozzle during formation of the nitrogen compound film.

2. The method for producing a nitrogen compound according to claim 1, wherein a distance between the substrate and the opening of the plasma nozzle is 150 mm or less.

3. The method for producing a nitrogen compound according to claim 1, further comprising:

preparing a container which houses the substrate and the gas supply module, and setting a pressure inside the container to 1 kPa or higher to cause a reaction between the active species and the raw material gas.

4. The method for producing a nitrogen compound according to claim 1, wherein a nitrogen atom density at the placement surface, which is measured in a state where the substrate is removed from a position where the substrate is placed, is $1\times10^{14}$ $cm^{-3}$ or more.

5. The method for producing a nitrogen compound according to claim 1, further comprising:

in-plane rotating the substrate to move a position of the substrate facing the opening of the plasma nozzle, during formation of the nitrogen compound film.

6. The method for producing a nitrogen compound according to claim 1, wherein the raw material gas is an organometallic gas which contains In.

7. The method for producing a nitrogen compound according to claim 6, wherein the raw material gas is a mixed gas consisting of a plurality of organic metals, and an amount of In in the nitrogen compound is changed by changing an mixed amount of organic metal containing In in the mixed gas, during formation of the nitrogen compound film.

8. An apparatus for producing a nitrogen compound, wherein the apparatus produces the nitrogen compound through vapor phase growth using a gas supply module which has a nozzle surface which faces a substrate placed on a placement portion, wherein the gas supply module includes a plasma nozzle which has an opening placed on the nozzle surface and discharges a plasma, which is obtained by being converted from a plasma source gas containing a nitrogen element, toward the substrate from the opening, and a raw material nozzle which has an opening, which is arranged on the nozzle surface and around the outside of the opening of the plasma nozzle, and discharges a raw material gas from the opening, an inclusion gas nozzle which has an opening, that is arranged further outward from the opening of the raw material nozzle on the nozzle surface, and discharges an inclusion gas containing a Group V element toward the substrate from the opening, and wherein an active species containing nitrogen contained in the discharged plasma is reacted with the discharged raw material gas to form a nitrogen compound film on the substrate.

9. The apparatus for producing a nitrogen compound according to claim 8, wherein a distance between the substrate and the opening of the plasma nozzle is 150 mm or less.

10. The apparatus for producing a nitrogen compound according to claim 8, wherein the apparatus includes a susceptor that in-plane rotates the substrate to move a position of the substrate which faces the opening of the plasma nozzle.

11. The apparatus for producing a nitrogen compound according to claim 8, wherein the number of the opening of the plasma nozzle is one or more, and a plurality of the openings of the raw material nozzles are provided for each of the opening of the plasma nozzle.

12. The apparatus for producing a nitrogen compound according to claim 11, wherein a plurality of the openings of the inclusion gas nozzles are provided to surround the plurality of the openings of the raw material nozzles.

13. The apparatus for producing a nitrogen compound according to claim 11, wherein a plurality of the openings of the plasma nozzles are provided.

14. The method for producing a nitrogen compound according to claim 1, wherein the nitrogen compound is at least one selected from the group consisting of gallium nitride, indium nitride, aluminum nitride, boron nitride, indium gallium nitride, indium aluminum nitride, and aluminum gallium nitride.

15. The apparatus for producing a nitrogen compound according to claim 8, wherein the nitrogen compound is at least one selected from the group consisting of gallium nitride, indium nitride, aluminum nitride, boron nitride, indium gallium nitride, indium aluminum nitride, and aluminum gallium nitride.

16. The method for producing a nitrogen compound according to claim 1, wherein a distance between the substrate and the opening of the plasma nozzle is 150 mm or less, a pressure inside a container which houses the substrate is 1 kPa or more, during formation of the nitrogen compound film, a nitrogen atom density at a position where the substrate has been placed, wherein the density is measured after the substrate is removed, is $1\times10^{14}$ $cm^{-3}$ or more, the plasma source gas contains nitrogen gas or ammonia, the raw material gases are any of triethyl gallium, trimethyl gallium, trimethyl indium, a mixed gas of triethyl gallium and trimethyl indium, and a mixed gas of trimethyl gallium and trimethyl indium, and the inclusion gas is nitrogen gas.

17. The method for producing a nitrogen compound according to claim 1, wherein the discharge of the raw material gas from the raw material nozzle is started after the discharge of the plasma from the plasma nozzle is started.

18. The apparatus for producing a nitrogen compound according to claim 8, wherein the distance between the substrate and the opening of the plasma nozzle is 150 mm or less, the pressure inside the container which houses the substrate is 1 kPa or more, during formation of the nitrogen compound film, the nitrogen atom density at a position where the substrate has been placed, wherein the density is measured after the substrate is removed at the placed surface, is $1\times10^{14}$ $cm^{-3}$ or more, the plasma source gas contains nitrogen gas or ammonia, the raw material gases are any of triethyl gallium, trimethyl gallium, trimethyl indium, a mixed gas of triethyl gallium and trimethyl indium, and a mixed gas of trimethyl gallium and trimethyl indium, and the inclusion gas is nitrogen gas.

* * * * *